(12) United States Patent
Chopra et al.

(10) Patent No.: US 10,945,357 B2
(45) Date of Patent: Mar. 9, 2021

(54) OPTICAL MODULE CAGE WITH CONFIGURABLE HEATSINK

(71) Applicant: CISCO TECHNOLOGY, INC., San Jose, CA (US)

(72) Inventors: Rakesh Chopra, Menlo Park, CA (US); Mandy Hin Lam, Fremont, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/282,127

(22) Filed: Feb. 21, 2019

(65) Prior Publication Data

US 2020/0275587 A1 Aug. 27, 2020

(51) Int. Cl.
*H05K 7/20* (2006.01)
*H05K 9/00* (2006.01)
*G02B 6/42* (2006.01)

(52) U.S. Cl.
CPC ......... *H05K 9/0058* (2013.01); *G02B 6/4261* (2013.01); *G02B 6/4269* (2013.01); *G02B 6/4277* (2013.01); *H05K 7/2039* (2013.01)

(58) Field of Classification Search
None
See application file for complete search history.

(56) References Cited

U.S. PATENT DOCUMENTS

| | | | |
|---|---|---|---|
| 6,252,161 B1 | 6/2001 | Hailey et al. | |
| 6,922,516 B2* | 7/2005 | Kurashima | G02B 6/4201 385/134 |
| 7,529,094 B2* | 5/2009 | Miller | G02B 6/4246 165/185 |
| 7,800,910 B2* | 9/2010 | Seynaeve | B60R 16/0239 361/715 |
| 8,760,870 B2* | 6/2014 | Yamamoto | G02B 6/4201 165/80.2 |
| 8,911,244 B2* | 12/2014 | Elison | H05K 7/20409 439/137 |
| 9,678,289 B1* | 6/2017 | Schultz | G02B 6/4267 |
| 10,128,590 B2* | 11/2018 | Benner | H01R 4/5083 |
| 2004/0203289 A1* | 10/2004 | Ice | H01R 13/6596 439/607.2 |
| 2006/0176666 A1* | 8/2006 | Saturley | G06F 1/20 361/679.46 |

(Continued)

FOREIGN PATENT DOCUMENTS

| | | |
|---|---|---|
| EP | 3079208 A1 | 10/2016 |
| EP | 3148011 A1 | 3/2017 |

OTHER PUBLICATIONS

CFP MSA Draft 1.0, Chris Cole, Finisar, Matt Traverso, OpNext, Eddie Tsumura, Sumitomo Electric Industries, Mar. 23, 2009.

(Continued)

*Primary Examiner* — Courtney L Smith
(74) *Attorney, Agent, or Firm* — Cindy Kaplan

(57) ABSTRACT

In one embodiment, an optical module cage includes a first opening for slidably receiving an optical module, a second opening positioned adjacent to the first opening for slidably receiving a riding heatsink separate from the optical module or an integrated heatsink connected to the optical module, and a guide rail interposed between the first opening and the second opening, wherein the guide rail is configured to support the riding heatsink and not interfere with insertion of the integrated heatsink.

19 Claims, 22 Drawing Sheets

(56) References Cited

U.S. PATENT DOCUMENTS

| | | |
|---|---|---|
| 2007/0053168 A1 | 3/2007 | Sayir et al. |
| 2010/0284152 A1* | 11/2010 | Harris .................. G02B 6/4246 |
| | | 361/715 |
| 2013/0077254 A1 | 3/2013 | Nguyen |
| 2016/0128230 A1 | 5/2016 | Lam et al. |
| 2016/0146434 A1 | 5/2016 | Mönch et al. |
| 2017/0075083 A1* | 3/2017 | Moore .................. B32B 27/281 |
| 2017/0192185 A1* | 7/2017 | Kelty .................. H04B 10/801 |
| 2018/0049348 A1* | 2/2018 | Bucher ................ G02B 6/4271 |

OTHER PUBLICATIONS

Cfp-transceiver-module-cfp-cfp2-c.pdf, FS.com, CFP Module Overview: CFP, CFP2, CFP4 & CFP8, Jul. 22, 2015.

X2-MSA p. 1.pdf, A Cooperation Agreement for a Small Versatile 10 Gigabit Transceiver Package, Issue 2.0b, Apr. 7, 2005.

\* cited by examiner

US 10,945,357 B2

OPTICAL MODULE CAGE WITH CONFIGURABLE HEATSINK

TECHNICAL FIELD

The present disclosure relates generally to communications networks, and more specifically to optical modules cages.

BACKGROUND

Over the past several years, there has been a tremendous increase in the need for higher performance communications networks. To satisfy the increasing demand of bandwidth and speed, pluggable transceiver modules (optical modules) are being used in line cards on various network devices (e.g., switches, routers, etc.). The pluggable transceiver modules are used to convert electrical signals to optical signals or in general as the interface to a network element copper wire or optical fiber. Increased performance requirements have also led to an increase in energy use resulting in greater heat dissipation from the pluggable modules.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1A:
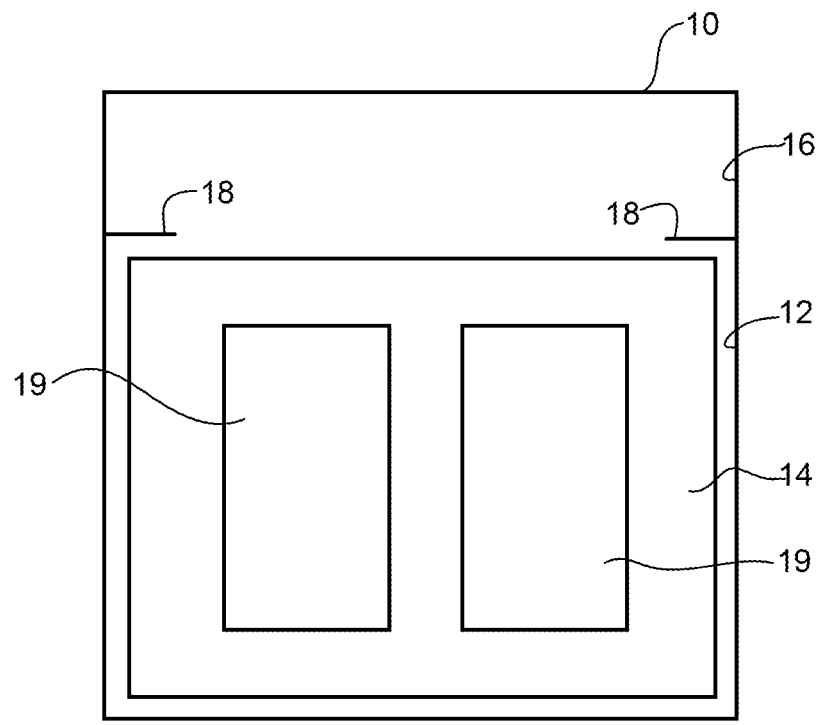
FIG. 1A is a schematic front view of an optical module in an optical module cage without a heatsink installed, in accordance with one embodiment.

In one embodiment, an optical module cage generally comprises a first opening for slidably receiving an optical module, a second opening positioned adjacent to the first opening for slidably receiving a riding heatsink separate from the optical module or an integrated heatsink connected to the optical module, and a guide rail interposed between the first opening and the second opening, wherein the guide rail is configured to support the riding heatsink and not interfere with insertion of the integrated heatsink.

In one or more embodiments, the guide rail extends inward from at least one side wall of the optical module cage. In one or more embodiments, the guide rail comprises a pair of rails extending inward from opposing side walls and spaced from one another to provide a channel for receiving the integrated heatsink.

In one or more embodiments, the optical module comprises a QSFP (Quad Small Form-Factor Pluggable) inserted into the first opening without the riding heatsink, the guide rail providing a guide for insertion of the optical module into the first opening generally aligned with a connector.

In one or more embodiments, the optical module comprises a QSFPDD (Quad Small Form-Factor Pluggable Double Density) inserted in the first opening and wherein the riding heatsink is inserted into the second opening.

In one or more embodiments, the optical module cage further comprises the optical module and the integrated heatsink inserted into the first and second openings of the optical module cage.

In one or more embodiments, the optical module cage comprises a spring for exerting a downward force on the riding heatsink to ensure thermal contact between the riding heatsink and the optical module. In one or more embodiments, the spring comprises spring members connected to side walls of the second opening and operable in combination with the guide rail to exert the downward force on the riding heatsink. In one or more embodiments, the spring is connected to an upper plate defining the second opening for exerting the downward force on the riding heatsink. In one or more embodiments, the spring comprises a plurality of spring fingers. In one or more embodiments, the spring is disposed on an upper surface of the heatsink and may comprise a compressible pad.

In one or more embodiments, the optical module cage further comprises an EMI (Electromagnetic Interference) shield at a rear wall of the second opening to allow airflow along fins of the riding heatsink or the integrated heatsink while reducing EMI emissions.

In one or more embodiments, the optical module cage is configured for receiving two optical modules side-by-side or a single optical module having an increased width.

In one or more embodiments, the optical module cage further comprises a sensor for detection of the riding heatsink.

In another embodiment, an optical module cage generally comprises a first opening for receiving an optical module, a second opening positioned adjacent to the first opening and comprising a riding heatsink, and a guide rail interposed between the first opening and the second opening and supporting the riding heatsink. The riding heatsink is slidably removable from the second opening for insertion of an optical module with an integrated heatsink into the first and second openings.

In yet another embodiment, a stacked optical module cage generally comprises optical module openings for slidably receiving optical modules, heatsink openings each configured for slidably receiving a riding heatsink separate from the optical modules or an integrated heatsink connected to one of the optical modules, and guide rails interposed between the optical module openings and the heatsink openings, wherein the guide rails are configured to support the riding heatsinks and not interfere with insertion of the integrated heatsinks.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Pluggable optical modules (transceiver modules) come in many different form factors such as SFP (Small Form-Factor Pluggable), QSFP (Quad Small Form-Factor Pluggable), QSFP+, QSFPDD (QSFP Double Density), OSFP (Octal Small Form-Factor Pluggable), and the like, and may support data rates up to 400 Gb/s, for example. The pluggable transceiver modules operate as an engine that converts electrical signals to optical signals or in general as the interface to the network element copper wire or optical fiber. Hosts for these pluggable modules include line cards used on switches, routers, edge products, and other network devices.

While some optical modules may operate without heatsinks (e.g., SFP, QSFP, QSFP+), other optical modules operate with riding heatsinks (e.g., QSFPDD) or integrated heatsinks (e.g., OSFP). A drawback with the integrated heatsink used with OSFP is that OFSP is not backwards compatible and the heatsink provides only front-to-back airflow. One reason for implementing a riding heatsink with QSFPDD is to provide backwards compatibility with deployed QSFP and QSFP+ optical modules. The riding heatsink also allows the size, shape, and material of the heatsink to be designed for a specific system (e.g., front-to-back, side-to-side, or bottom-to-top airflow). Although, as the vast majority of systems move from side-to-side or bottom-to-top airflow to front-to-back airflow, the flexibility of system design is becoming less important. A drawback with riding heatsinks is that they present additional thermal resistance based on the material contact of the riding heatsink to the top of the cage. As telecommunication systems speeds and power requirements increase, emission from the pluggable module increases along with a need for improved cooling, and the thermal resistance present with riding heatsinks may become more of an issue.

The embodiments described herein provide an optical module cage design that is backwards compatible with QSFP and QSFP+, which are widely deployed, and soon to be deployed QSFPDD modules, with and without heatsinks, and forward compatible with a QSFP/QSFPDD style form factor that supports an integrated heatsink that will provide needed heat dissipation for higher power optical modules. It is to be understood that the optical module form factors described herein are only examples and that the optical module cages described herein may be used with other standard form factor modules or future optical module designs.

In one or more embodiments, an optical module cage includes a first opening for slidably receiving an optical module, a second opening positioned adjacent to the first opening for slidably receiving a riding heatsink separate from the optical module or an integrated heatsink connected to the optical module, and a guide rail interposed between the first and second openings. The guide rail is configured to guide the optical module into the first opening when used without a heatsink, provide space to receive the integrated heatsink when connected to the optical module, and support the riding heatsink when used with the optical module. The optical module cage thus supports an optical module without a heatsink, an optical module with an integrated heatsink, or an optical module configured for use with a pluggable riding heatsink, thereby providing optimal thermal design with backwards compatibility. As described in detail below, the optical module cage may be configured to receive one optical module (or optical module and heatsink) or a plurality of optical modules (or optical modules and heatsinks) (e.g., stacked or ganged optical module cage).

Figure 1B:
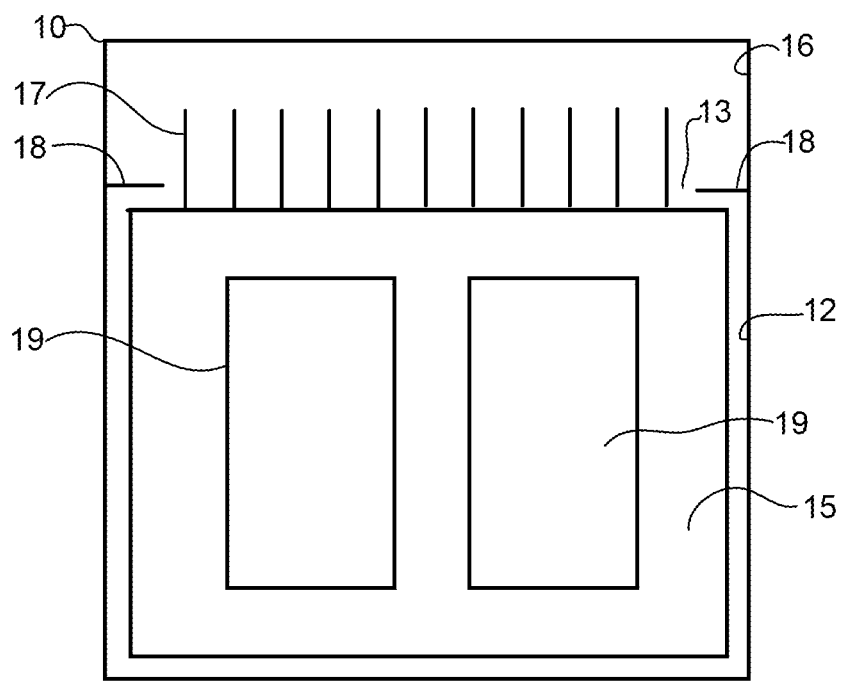
FIG. 1B is a schematic front view of an optical module with an integrated heatsink installed in the optical module cage of FIG. 1A, in accordance with one embodiment.
Figure 4A:
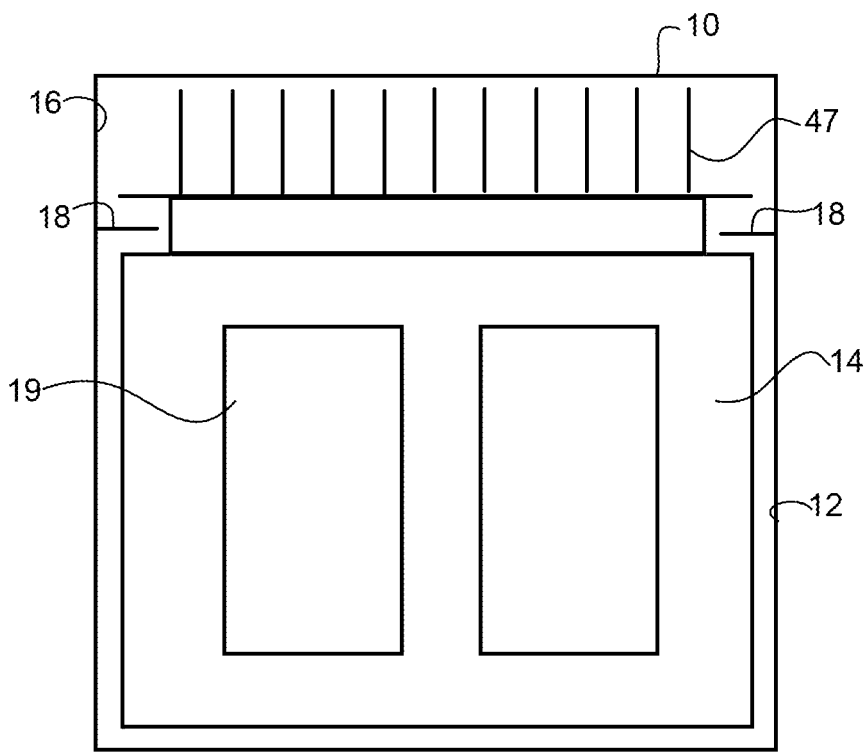
FIG. 4A is a schematic front view of the optical module and a riding heatsink installed in the optical module cage of FIG. 1A, in accordance with one embodiment.

Referring now to the drawings, and first to FIG. 1A, an optical module cage (housing, cage structure) 10 for receiving an optical module (pluggable module, optics modules, pluggable optical module, optical transceiver (e.g., SFP, OSFP, QSFP, QSFP+, QSFPDD, and the like)) is shown. In one example, optical module 14 in FIG. 1A comprises a QSFP or other form factor optical module (e.g., low power optics) that does not require a heatsink. The optical module cage 10 comprises a first opening (port) 12 for slidably receiving the optical module 14 and a second opening 16 adjacent to (e.g., above) the first opening 12 for slidably receiving a heatsink (e.g., integrated heatsink 17 attached to an optical module 15 (FIG. 1B) or a riding heatsink 47 separate from the optical module) (as shown in FIG. 4A)). As shown in FIG. 1B, the integrated heatsink extends downward into the optical module opening 12. The riding heatsink 47 also extends downward into the optical module opening 12 where it is in thermal contact with the optical module (FIG. 4A).

A guide rail comprising horizontal rails 18 is interposed between the two openings 12, 16 and allows for optical modules with and without integrated heatsinks to be plugged into the cage 10. If the optical module 14 is inserted without a heatsink, as shown in FIG. 1A, the guide rail ensures that the optical module is properly inserted to align with a connector located in the back of the optical module cage 10, thereby preventing a user from inserting the optical module too high up in the cage. The guide rails 18 comprise generally horizontal members extending inward from opposing side walls and spaced from one another to provide a channel (gap, space) 13 for receiving the integrated heatsink 17 (FIG. 1B). The spacing between the guide rails 18 allows the integrated heatsink 15 to be inserted without interference and connects the first and second openings to allow direct thermal contact between the riding heatsink 47 and the optical module. In one example, the optical module 15 in FIG. 1B comprises an optical module (e.g., high power optics) that includes the integrated heatsink 17.

The heatsink 17 is configured to maximize the surface area in contact with a cooling medium (e.g., air) surrounding the heatsink (FIG. 1B). The heatsink 17 transfers heat generated by the optical module 15 where heat dissipation capability of the module is insufficient to moderate its temperature. The heatsink 17 comprises a set of fins, which allow excess thermal energy to dissipate into the environment by conduction and convection. The heatsink 17 carries heat away from the optical module 15 and into the fins, which provide a large surface area for the heat to dissipate, thus cooling the heatsink and optical module 15. The fins define a plurality of air flow channels for dissipating heat from the optical module 15 when inserted into the optical module cage 10. The cooling channels extend longitudinally along a portion of the length of the pluggable optical module cage 10 and allow for airflow along the length of the cage, as described below with respect to FIG. 5B. The heatsink 17 may, for example, be formed from copper, aluminum, or another suitable material. The heatsink may be extruded and comprise stacked fins, for example. It is to be understood that the shape or size of the heatsink or the configuration or number of fins may be different than shown herein, without departing from the scope of the embodiments.

The optical module 14, 15 shown in FIGS. 1A and 1B comprises two front connectors 19 (e.g., LC or other suitable connector). The cage 10 also comprises connectors (interfaces) for connecting the optical modules with electronic components on a line card or other electronic component operable to utilize transceivers and interface with a telecommunications network, as described below with respect to FIG. 20. The pluggable optical module 14, 15 may be configured to support gigabit Ethernet, Fibre Channel, or other communication standards.

Figure 2:
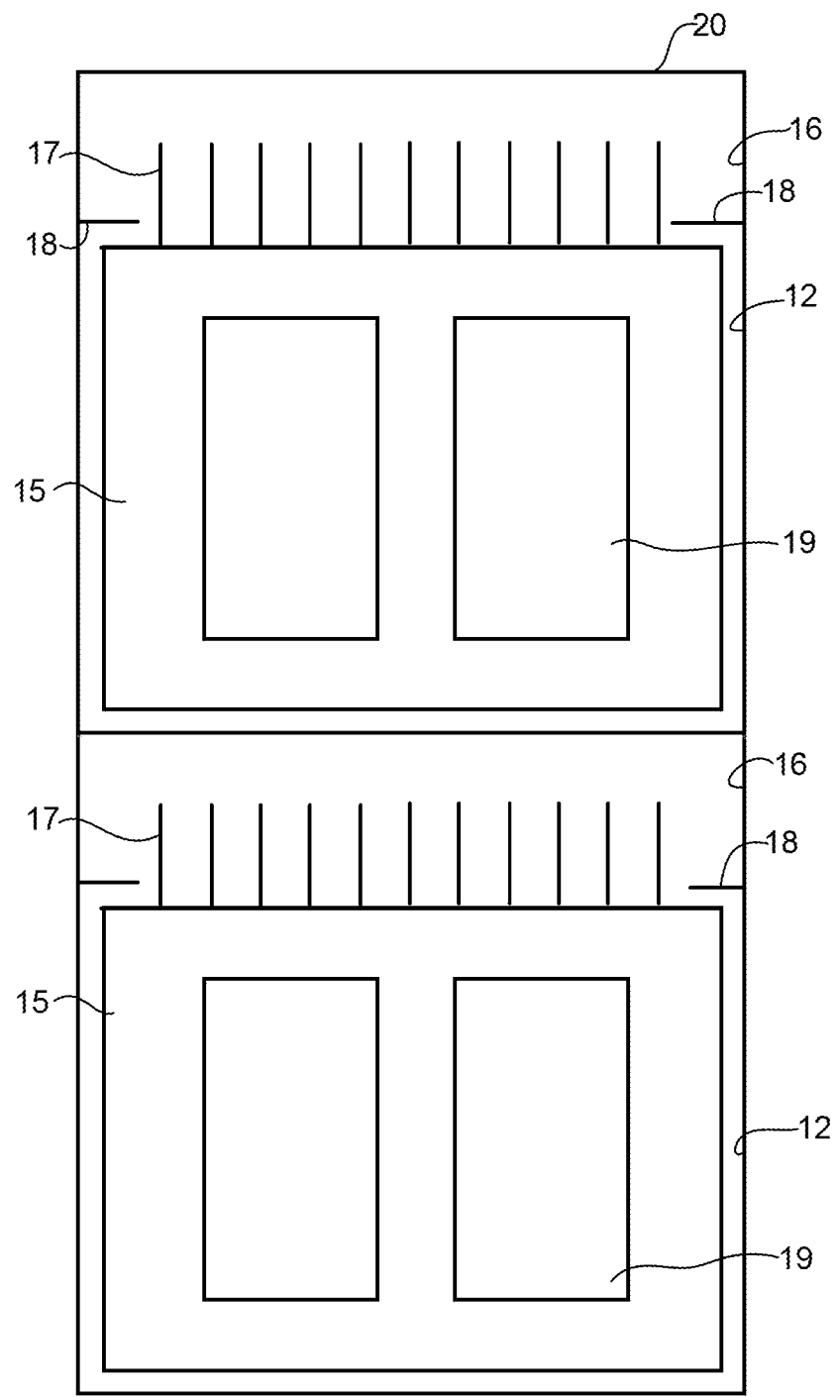
FIG. 2 is a schematic front view of optical modules with integrated heatsinks installed in a stacked optical module cage, in accordance with one embodiment.
Figure 8A:
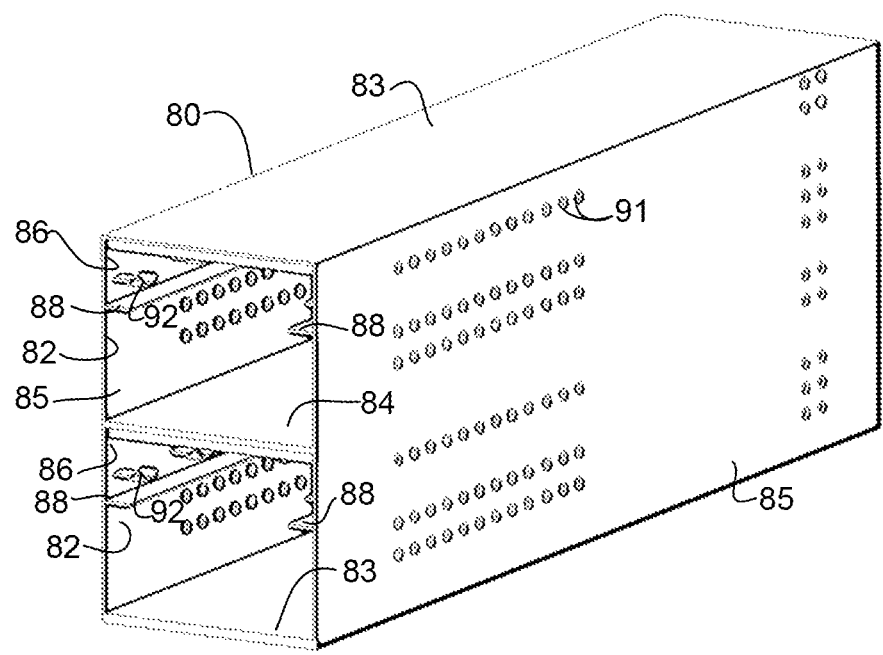
FIG. 8A is a perspective of a stacked optical module cage with spring members on side walls of the optical module cage, in accordance with one embodiment.
Figure 19A:
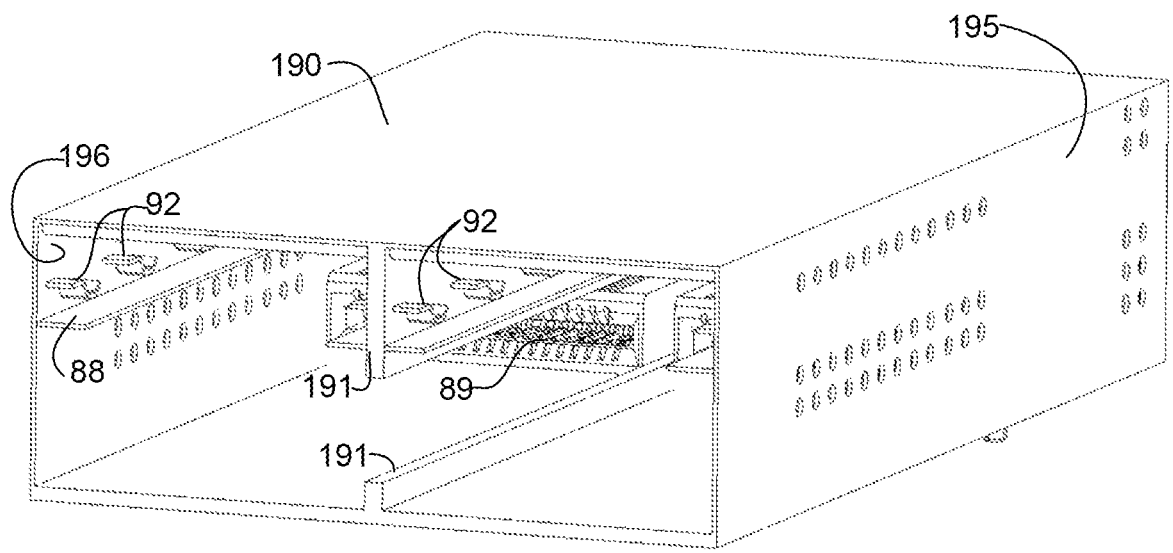
FIG. 19A is a perspective of an optical module cage for receiving side-by-side optical modules, in accordance with one embodiment.
Figure 19B:
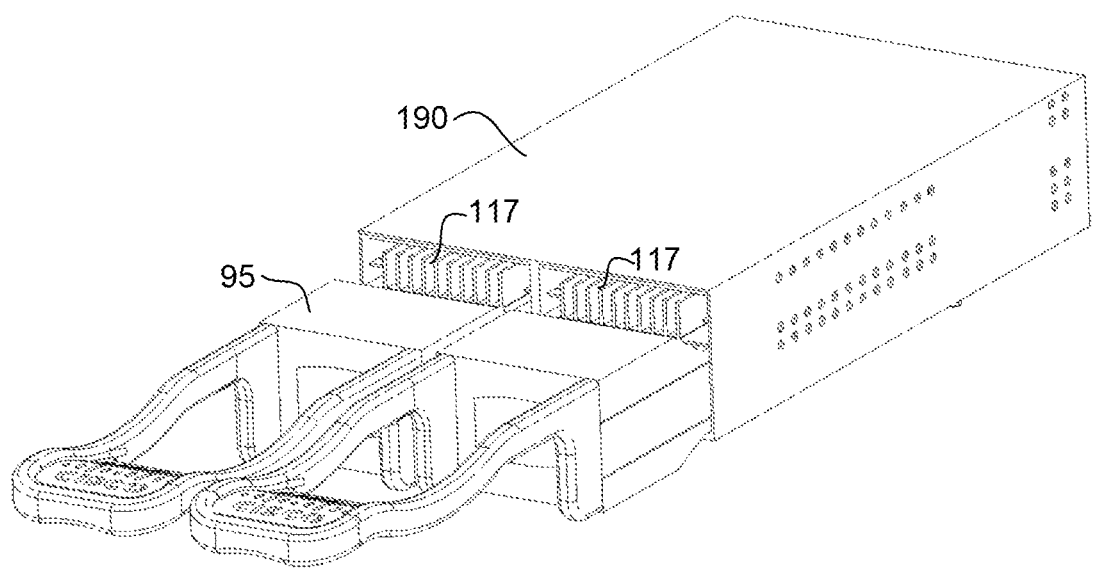
FIG. 19B is a perspective of the optical modules with integrated heatsinks installed in the optical module cage shown in FIG. 19A.

In the examples shown in FIGS. 1A and 1B, the optical module cage comprises one opening 12 for receiving one pluggable module 14 and one opening 16 for receiving a heatsink (integrated or riding). The optical module cage may also include openings for receiving additional optical modules in a stacked or side-by-side arrangement (e.g., 2×1 (two rows with one module in each row) (stacked) (as shown in FIGS. 2 and 8A), 1×2 (1 row with two modules) (side-by-side) (as shown in FIGS. 19A and 19B), 2×2 (two rows, two modules in reach row), 2×4 (two rows, four modules in each row), etc.). An optical module cage with multiple optical module and heatsink openings may include the same or different heatsink configurations. For example, an optical module cage may include one or more optical modules with no heatsinks, one or more optical modules with integrated heatsinks, one or more optical modules with riding heatsinks, or any combination thereof.

FIG. 2 illustrates an example of a stacked optical module cage 20 for receiving two of the optical modules 15 with integrated heatsinks 17 in a stacked arrangement. The optical module cage 20 includes two openings 12 for receiving the optical modules 15 and two openings 16 for receiving the heatsinks 15, as previously described.

The term "stacked" as used herein refers to one module positioned in a location vertically above another module and the term "side-by-side" as used herein refers to two modules positioned horizontally adjacent to one another. It is to be understood that the terms above/below, upper/lower, top/bottom, horizontal/vertical, or front/rear as used herein are relative to the position of the cage and also cover other orientations of the cage. Thus, the terms are used only for ease of description and are not to be interpreted as limiting the arrangement of openings or components within an optical module cage. Also, it is to be understood that the terms side wall, upper plate, center plate, or bottom plate as used herein refer to portions of the cage surrounding the openings. Thus, in a side-by-side arrangement, a wall between two openings may be a side wall for each of the openings, even though it is not an external side wall of the optical module cage. Similarly, in a stacked configuration, an upper plate of an opening may refer to an external top plate of the optical module cage or a center plate between two openings.

Figure 3A:
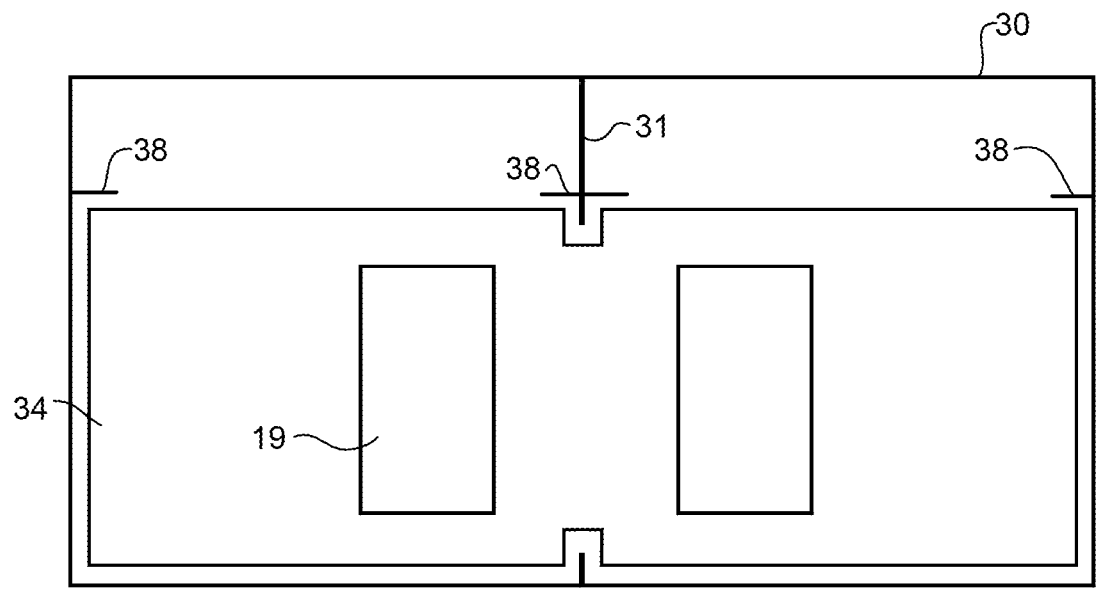
FIG. 3A is a schematic front view of a double wide optical module installed in an optical module cage, in accordance with one embodiment.
Figure 3B:
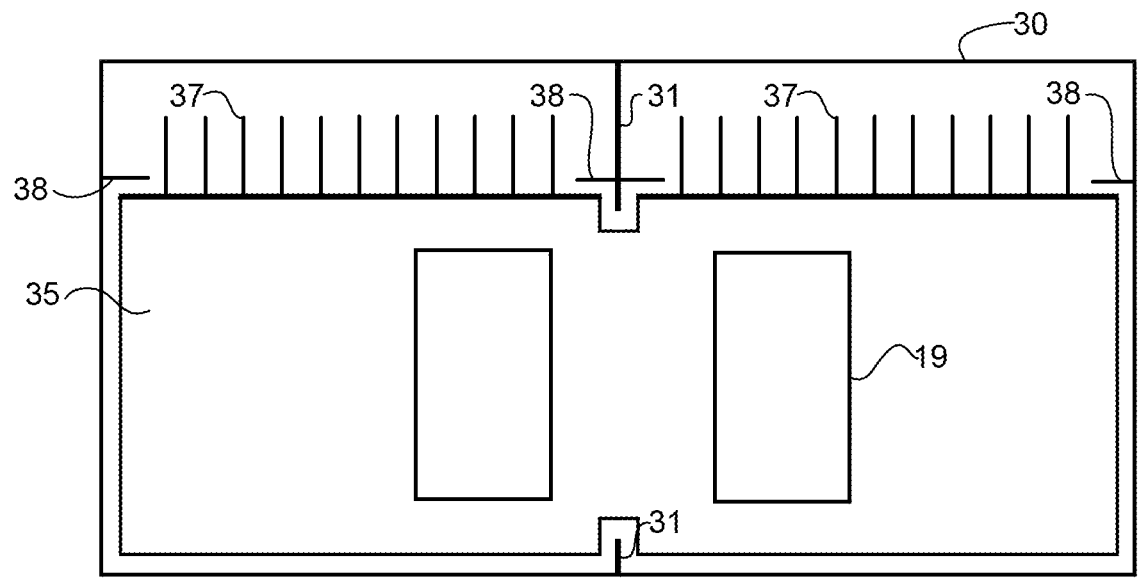
FIG. 3B is a schematic front view of a double wide optical module with integrated heatsink installed in the optical module cage of FIG. 3A.

As shown in FIGS. 3A and 3B an optical module cage 30 may be configured for receiving a larger width (e.g., double width) optical module 34 to provide increased bandwidth or increased thermal cooling capacity, for example. Optical module cage 30 may, for example, receive a wider optical module 34 (without heatsink) (FIG. 3A), an optical module 35 with integrated heatsink 37 (FIG. 3B), or an optical module and riding heatsinks (not shown). The optical module cage 30 may also receive two standard sized optical modules 14 (without heatsinks) or two optical modules 15 (with heatsinks) (FIGS. 1A, 1B, 3A, 3B). Guide rails 38 extend from the side walls and a center wall (vertical guide rail) 31. The guide rails 31, 38 provide guidance during insertion of the optical module 34, 35 (or optical modules 14, 15). As previously described, the guide rails 38 may also support riding heatsinks and allow space for inserting the integrated heatsink 37. As shown in FIGS. 3A and 3B, the wider optical module 34 may include notches aligned with the guide rails 31. Riding heatsinks may ride on the two halves of the module independently in the heatsink openings.

Figure 4B:
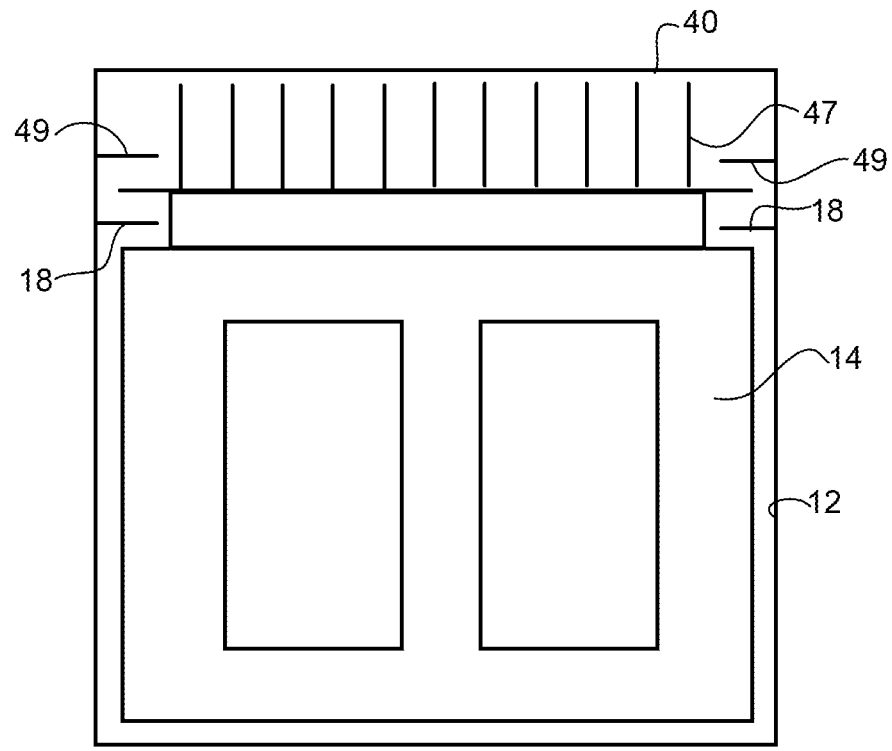
FIG. 4B is a front view of the optical module and riding heatsink installed in an optical module cage with an extra guide rail, in accordance with another embodiment.

FIGS. 4A and 4B illustrate a riding heatsink 47 installed in upper opening 16 of the optical module cage 10, in accordance with one embodiment. As previously described, the optical module cage 10 includes a lower opening 12 for receiving the optical module 14 and upper opening 16 for receiving the riding heatsink 47. As shown in FIG. 4B, an additional guide rail 49 may be included to guide insertion of the riding heatsink 47. As described in detail below, various methods may be used to apply downward pressure on the riding heatsink 47 to ensure contact between the heatsink and optical module 14. For example, a spring (compression springs, spring members, spring fingers) may be located within the optical module cage and configured to exert a downward force on the riding heatsink to ensure thermal contact between the riding heatsink and a top surface of the optical module, as described below with respect to FIGS. 8A-15C. The spring may instead be located on the riding heatsink, as described below with respect to FIGS. 16A-18B, to provide thermal contact between the heatsink and the optical module. In one example, the heatsink 14 in FIGS. 4A and 4B comprises a QSFPDD or other form factor optical module (e.g., medium power optics) that requires use of the riding heatsink 47.

Figure 5A:
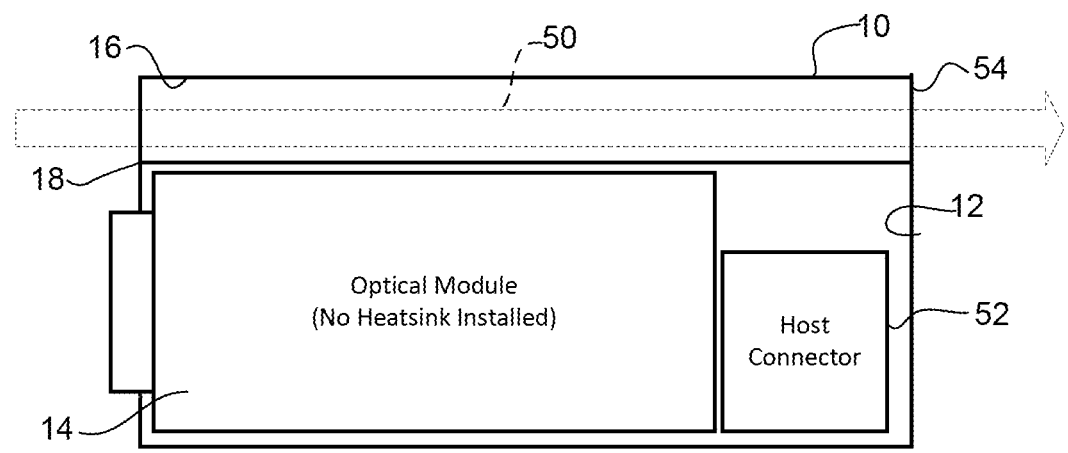
FIG. 5A is a schematic side view of the optical module and optical module cage of FIG. 1A.
Figure 5B:
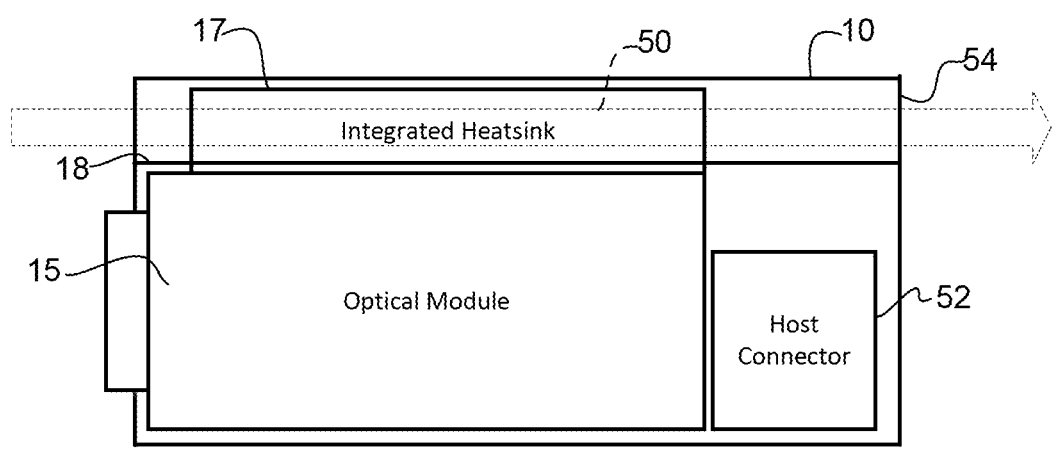
FIG. 5B is a schematic side view of the optical module with integrated heatsink and optical module cage of FIG. 1B.

FIGS. 5A and 5B illustrate airflow through the optical module cage 10 without a heatsink and with the integrated heatsink 17, respectively. The airflow in this example is front-to-back as indicated at arrow 50. Host connector 52 is contained within the cage 10. The optical module cage 10 is configured to improve EMC (Electromagnetic Compatibility) shielding by reducing radiation from the cage. In order to avoid EMI (Electromagnetic Interference) emissions, a rear portion 54 of the cage 10 enclosing heatsink opening 16 provides EMI containment. As described below, the rear portion 54 of the cage 10 includes venting holes to allow airflow through opening 16 past the heatsink 17.

Figure 6A:
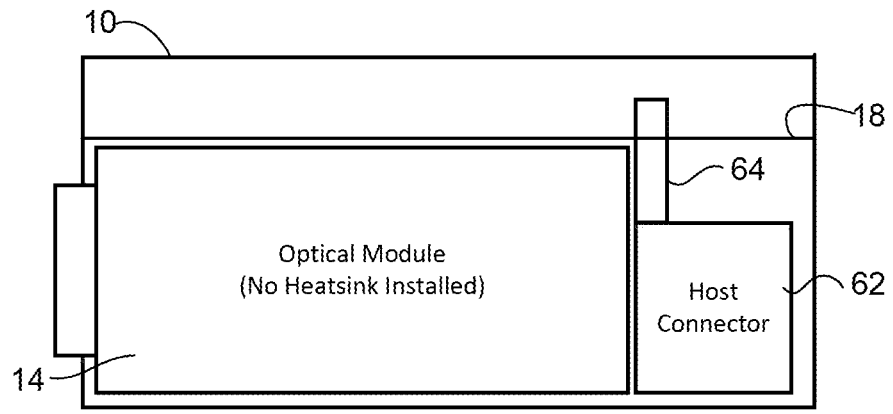
FIG. 6A is a schematic side view of the optical module installed in the optical module cage without a heatsink and mated with a host connector with a connector extension, in accordance with one embodiment.
Figure 6B:
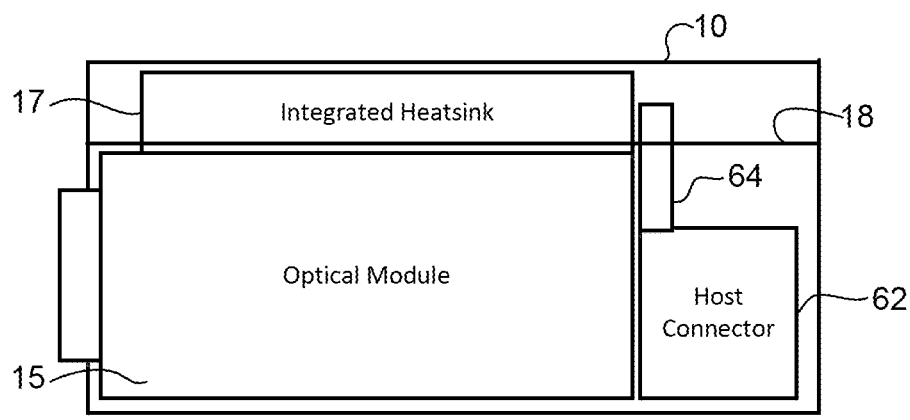
FIG. 6B is a schematic side view of the optical module and integrated heatsink installed in the optical module cage of FIG. 6A.
Figure 6C:
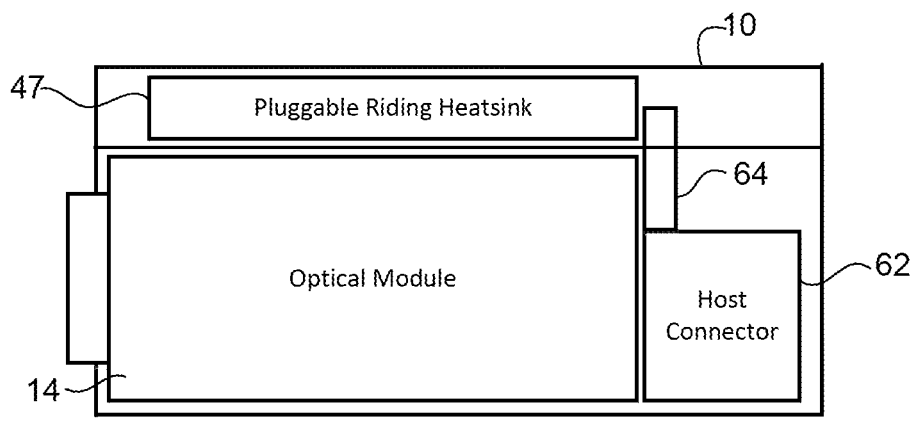
FIG. 6C is a schematic side view of the optical module and riding heatsink installed in the optical module cage of FIG. 6A.

FIGS. 6A, 6B, and 6C are schematic side views of the optical module inserted into the cage without a heatsink, with an integrated heatsink, and with a pluggable riding heatsink, respectively. In this example, a host connector 62 comprises a socket configured to mate with a QSFPDD module. The connector 62 includes an extension 64 that may be used to detect insertion of the pluggable riding heatsink 47. As described below, the extension 64 may include a sensor that sends a signal to a line card controller indicating if the riding heatsink 47 has been inserted into the cage 10 (FIG. 6C). The host connector 62 is also compatible with the optical module 14 installed without a heatsink (FIG. 6A) or the optical module 15 with integrated heatsink 17 (FIG. 6B).

Figure 7:
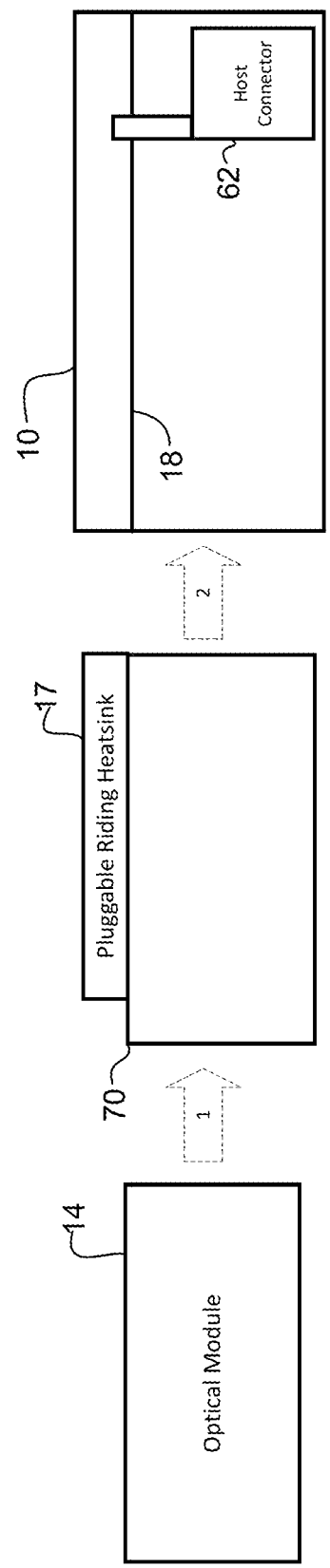
FIG. 7 is a schematic illustrating installation of the optical module and riding heatsink with use of a sleeve, in accordance with one embodiment.

FIG. 7 illustrates an alternate design for insertion of the pluggable riding heatsink 17 into the optical module cage 10. In this example, a sleeve 70 is provided into which the optical module 14 is inserted (step 1). The sleeve 70 containing the optical module and riding heatsink 17 is then inserted into the optical module cage 10 (step 2).

As previously described, the optical module cage is configured for receiving one or more optical modules with no heatsink installed, with an integrated heatsink attached to the optical module, or a riding heatsink installed in the optical module cage. The optical module cage or riding heatsink may further comprise a spring (spring members, compressible pad, spring fingers, compression spring) for asserting downward pressure to ensure thermal contact between the riding heatsink and the optical module. Examples of optical module cage designs for use with optical modules with or without heatsinks are described below. In the following examples, FIGS. 8A-11C illustrate an optical module cage with spring members attached to side walls of the optical module cage for exerting downward pressure on a base of the riding heatsink along the length of the guide rail. FIGS. 12A-15C illustrate an example of an optical module cage with spring members attached to an upper plate of the heatsink opening for exerting downward pressure on an upper surface of the riding heatsink. FIGS. 16A-18B illustrate a spring installed on an upper surface of the riding heatsink for use in providing thermal contact between the riding heatsink and the optical module.

Figure 9A:
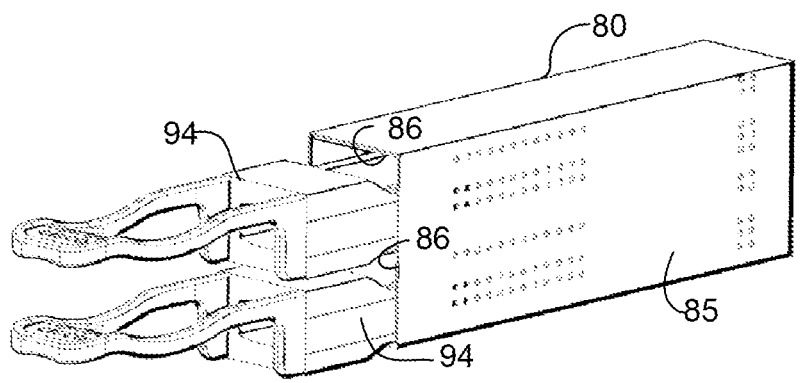
FIG. 9A is a perspective of optical modules installed in the optical module cage of FIG. 8A.
Figure 9B:
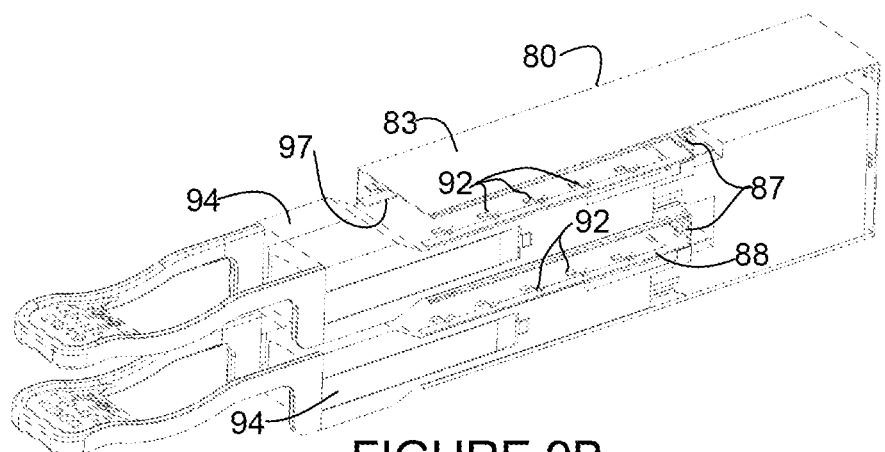
FIG. 9B is a perspective of the optical modules installed in the optical module cage of FIG. 8B.
Figure 9C:
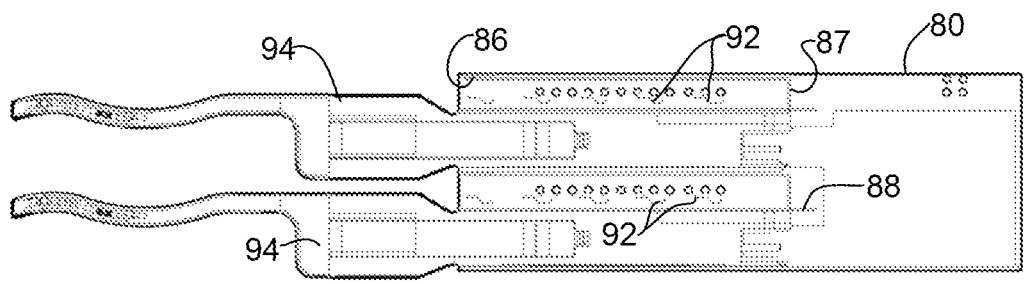
FIG. 9C is a side view of the optical modules and optical module cage of FIG. 9B.
Figure 10A:
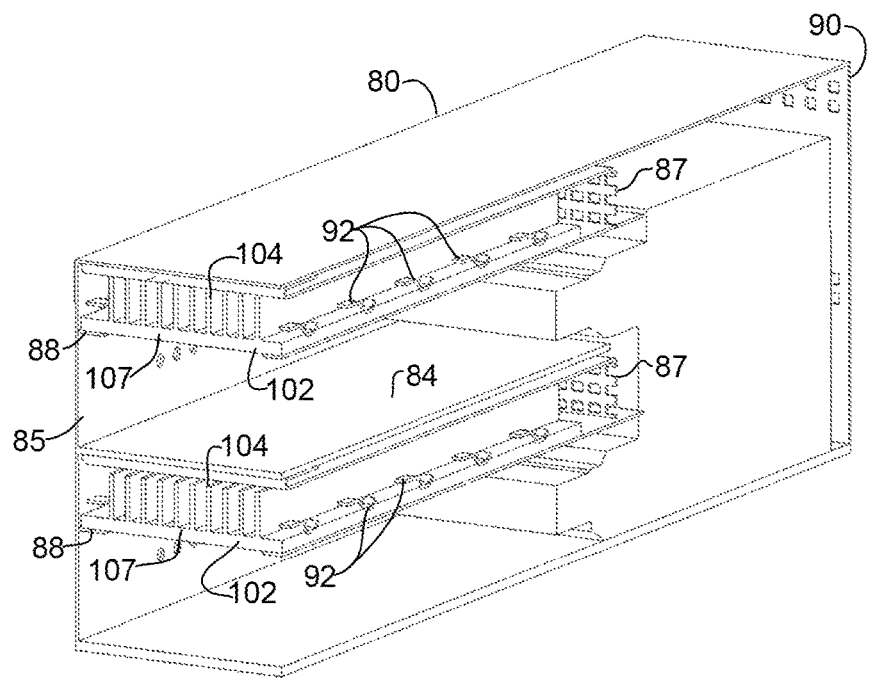
FIG. 10A is a perspective of the stacked optical module cage with riding heatsinks installed and a side wall removed to show detail.
Figure 10B:
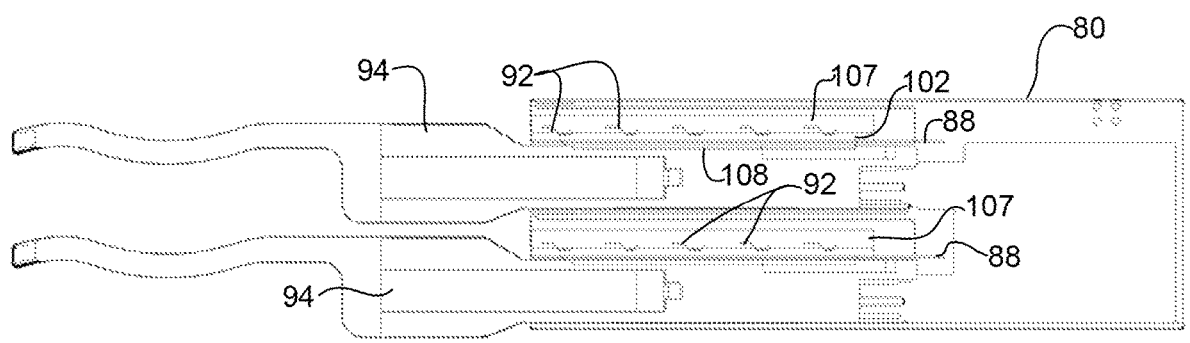
FIG. 10B is a side view of the optical module cage and riding heatsinks of FIG. 10A.
Figure 11A:
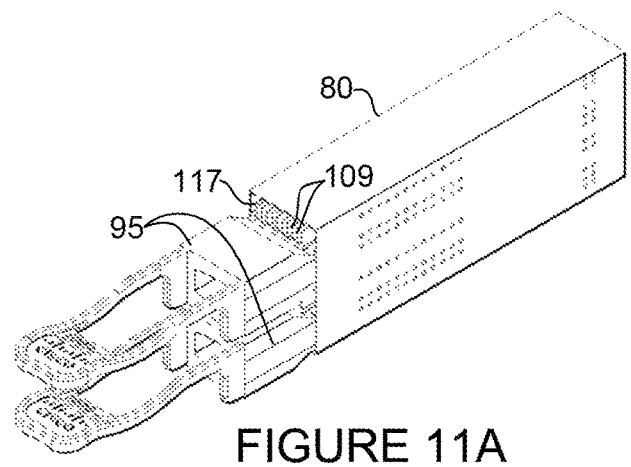
FIG. 11A is a perspective of optical modules with integrated heatsinks installed in the optical module cage of FIG. 8A, in accordance with one embodiment.
Figure 11B:
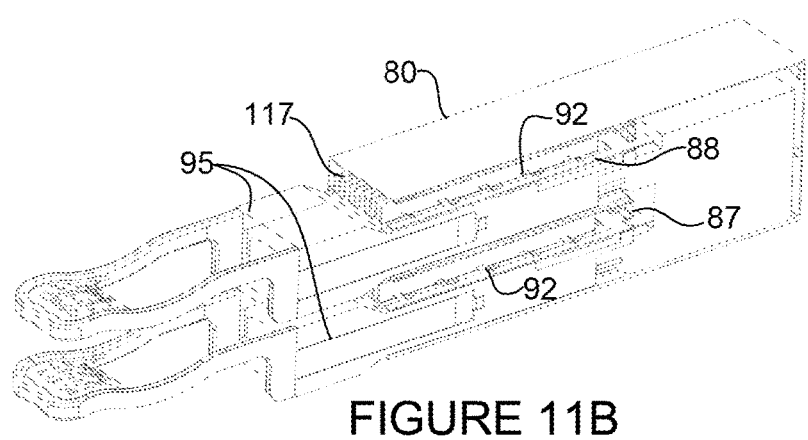
FIG. 11B is a perspective of the optical modules and integrated heatsinks installed in the optical module cage of FIG. 11A with a side wall removed to show detail.
Figure 11C:
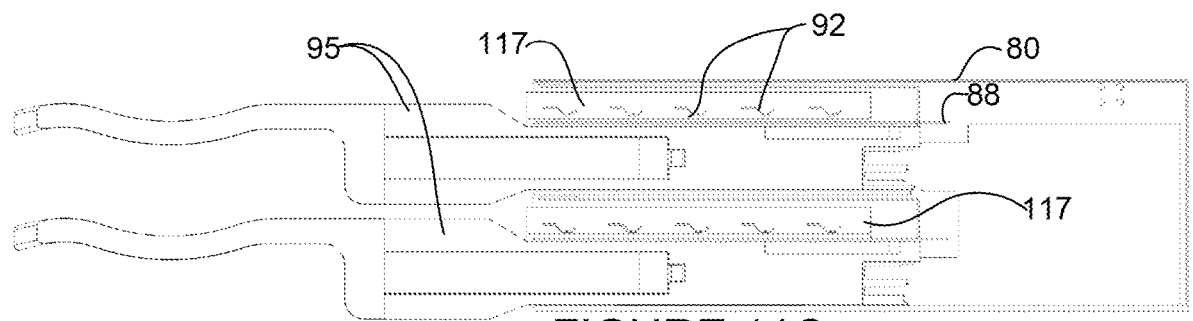
FIG. 11C is a side view of the optical modules and integrated heatsinks installed in the optical module cage of FIG. 11B.

Referring first to FIGS. 8A-11C an optical module cage 80 is shown with a spring (spring members 88) on side walls of heatsink openings 86 of the optical module cage, in accordance with one embodiment. FIGS. 8A-8B show the cage 80 with no optical modules or heatsinks installed, FIGS. 9A-9C show optical modules 94 installed with no heatsinks, FIGS. 10A-10B show riding heatsinks 107 installed, and FIGS. 11A-11C show optical modules 95 with integrated heatsinks 117.

Figure 8B:
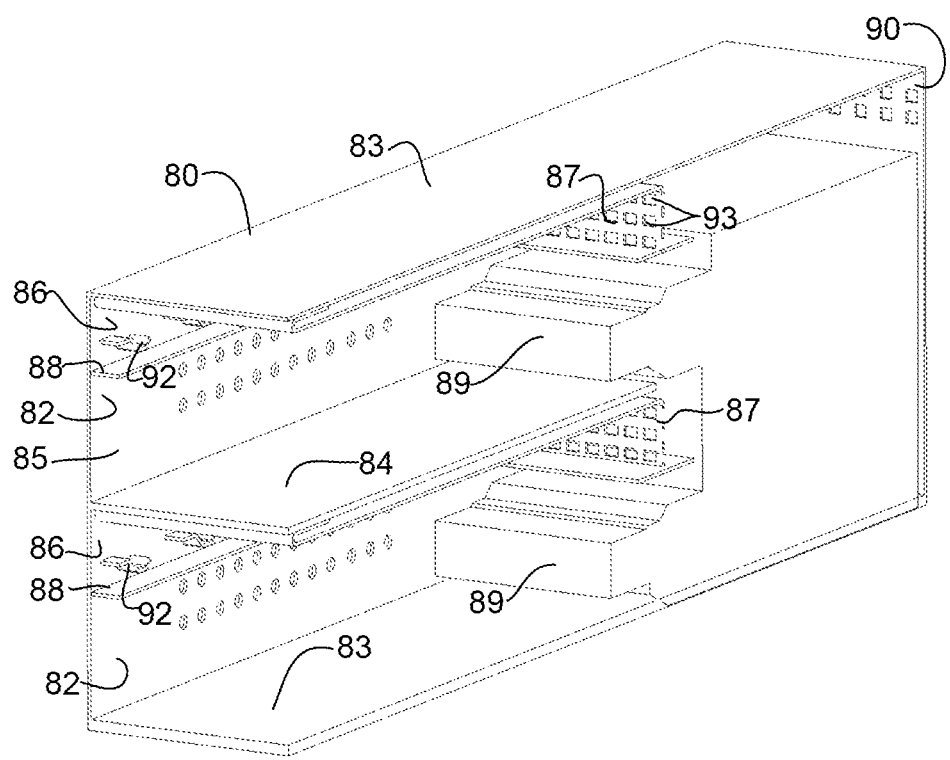
FIG. 8B is a perspective of the stacked optical module cage of FIG. 8A with a side wall removed to show detail.

FIGS. 8A and 8B are perspectives of the optical module cage 80 with a side wall 85 removed in FIG. 8B to show details within the optical module cage. The example shown in FIGS. 8A and 8B is a stacked cage configuration for receiving two optical modules in a stacked configuration. The optical modules are received in the optical module openings (first openings) 82. The optical module cage 80 further comprises heatsink openings (second openings) 86 for receiving an integrated heatsink attached to an optical module or a riding heatsink separate from the optical module, if used with the optical module. Guide rails 88 are interposed between the first and second openings 82, 86 and define the optical module and heatsink openings, while providing a gap connecting the two openings. The openings are further defined by upper and lower plates 83 and center plate 84, which extend between and are connected to the side walls 85. As previously described, air flows through the heatsink openings 86 (e.g., through airflow channels defined by heatsink fins if a heatsink is in place) and through openings 93 in a plate 87, which provides EMI protection and airflow optimization, and through openings in rear wall 90. In the example shown in FIG. 8B, the perforated plate 87 extends downward from either top plate 83 or center plate 84. In the 2×1 stacked configuration shown in FIGS. 8A and 8B, airflow through openings 91 in the side wall 85 may also provide cooling. The optical modules connect to electrical components through connectors (mating interfaces) 89 (FIG. 8B).

In the embodiment shown in FIGS. 8A and 8B, downward compression spring members 92 extend from the side walls 85 at a location above the guide rails 88. As described in detail below, the spring members 92 exert a downward force on the riding heatsink to provide thermal contact between the heatsink and the optical module. The spring member 92 may be formed from a curved metal element (finger) as shown in FIGS. 8A and 8B or any other suitable spring may be used in combination with the guide rail 88 to create downward pressure on the riding heatsink.

FIGS. 9A, 9B, and 9C show the optical module cage 80 of FIG. 8A with optical modules 94 inserted into the optical module openings. In this example, there is no heatsink inserted into the heatsink opening 86. One of the side walls 85 is removed in FIGS. 9B and 9C to show details within the optical module cage 80. Since there is no riding heatsink inserted, the spring members 92 are in a relaxed (uncompressed) position. As previously described, the guide rail 88 is configured to support a riding heatsink (as shown in FIG. 10A) without interfering with insertion of an optical module with an integrated heatsink (as shown in FIG. 11A). In the example shown in FIG. 9B, the guide rail is a generally U-shaped plate with rails 88 sufficiently spaced apart to provide a channel 97 for receiving the integrated heatsink and wide enough to support the riding heatsink.

FIGS. 10A and 10B show riding heatsinks 107 inserted into the heatsink openings in the optical module cage 80. One of the side walls 85 is removed in FIGS. 10A and 10B to show details within the optical module cage 80. Optical modules 94 are inserted into the optical module cage 80 with the riding heatsinks 107 in FIG. 10B. The riding heatsink 107 comprises a plurality of fins 104 that define longitudinal airflow channels and a base 102 with a contact portion (pedestal) 108 extending downward therefrom for thermal contact with an upper surface of the optical module 94 (FIGS. 10A and 10B). Each side of the base 102 slides between the guide rail 88 and spring fingers 92 when the heatsink 107 is inserted into the optical module cage 80. The spring fingers 92 exert downward pressure on the riding heatsink 107 to create thermal contact between the heatsink and the optical module 94 (FIG. 10B).

FIGS. 11A-11C illustrate optical modules 95 with integrated heatsinks 117 inserted into the optical module cage 80. Since the heatsinks 117 are mounted directly onto the optical module, there is no need to exert a downward pressure on the heatsink to force it into thermal contact with the optical module as was done with the riding heatsink. The spring members 92 are in their uncompressed (relaxed) state, as shown in FIG. 11C. Fins of the heatsink 117 are spaced inward from an edge of the optical module 95 to prevent interference between the rails 88 and the heatsink during insertion of the optical module and heatsink into the cage 80.

Figure 12A:
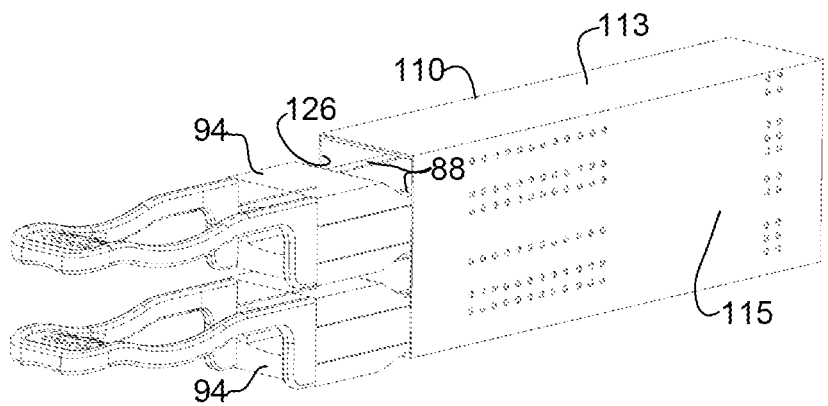
FIG. 12A is a perspective of the optical modules installed in a stacked optical module cage with spring members on upper surfaces of heatsink openings of the optical module cage, in accordance with one embodiment.
Figure 13A:
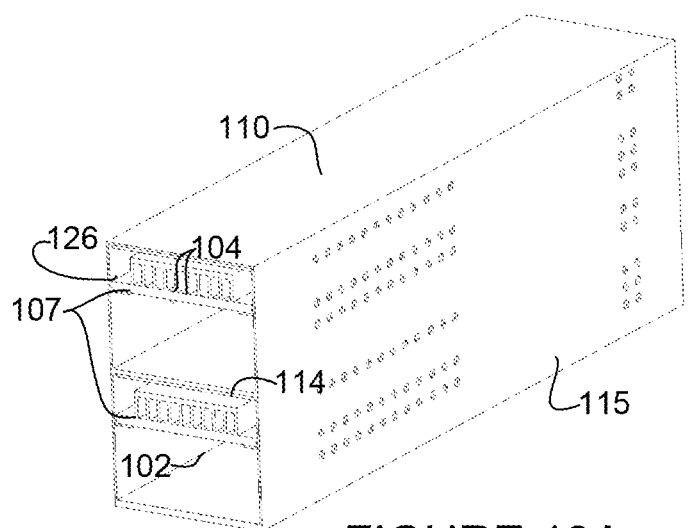
FIG. 13A is a perspective of the optical module cage of FIG. 12A with riding heatsinks installed and the optical modules removed.
Figure 13B:
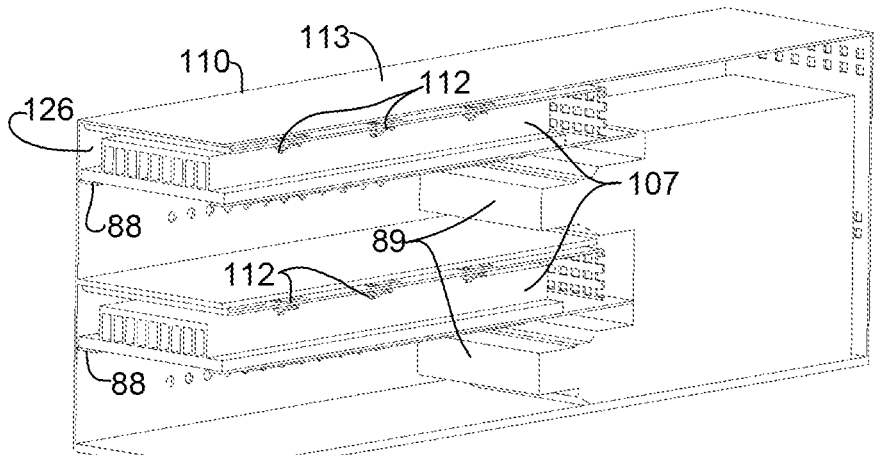
FIG. 13B is a front perspective of the riding heatsinks installed in the optical module cage of FIG. 13A with a side wall removed to show detail.
Figure 13C:
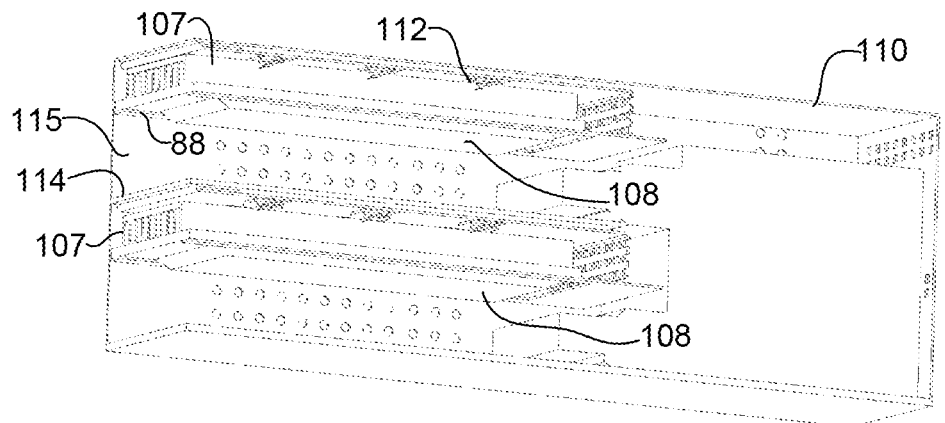
FIG. 13C is another perspective of the riding heatsinks installed in the optical module cage of FIG. 13B.
Figure 14A:
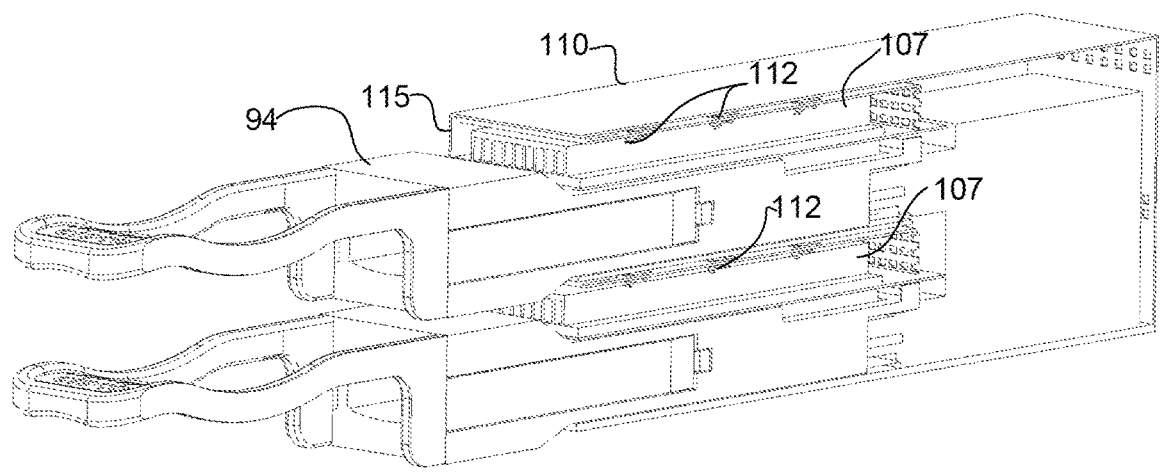
FIG. 14A is a perspective of the optical modules installed in the optical module cage with the riding heatsinks of FIG. 13B.
Figure 14B:
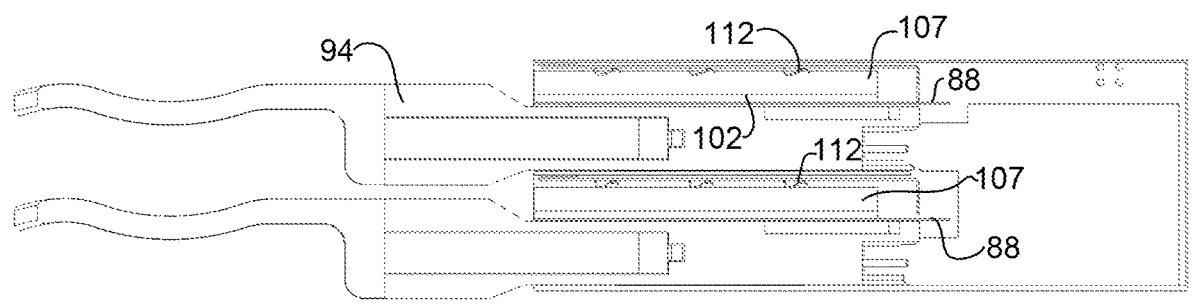
FIG. 14B is a side view of the optical modules installed in the optical module cage with the riding heatsinks of FIG. 14A.
Figure 15A:
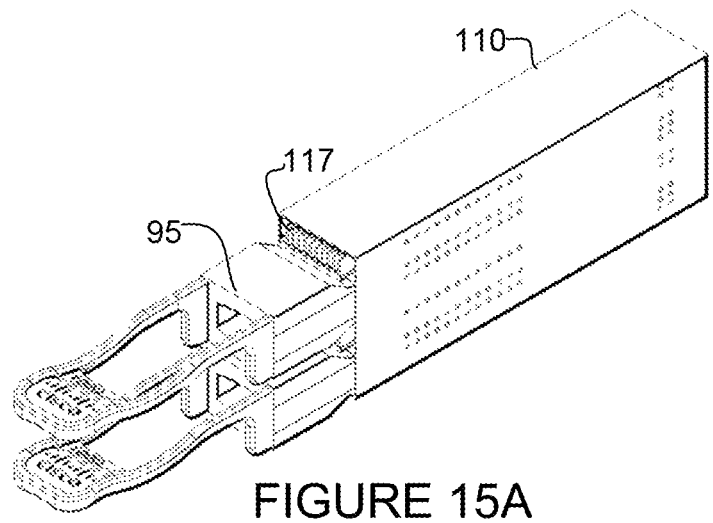
FIG. 15A is a perspective of the optical modules with integrated heatsinks installed in the optical module cage shown in FIG. 12A, in accordance with one embodiment.
Figure 15B:
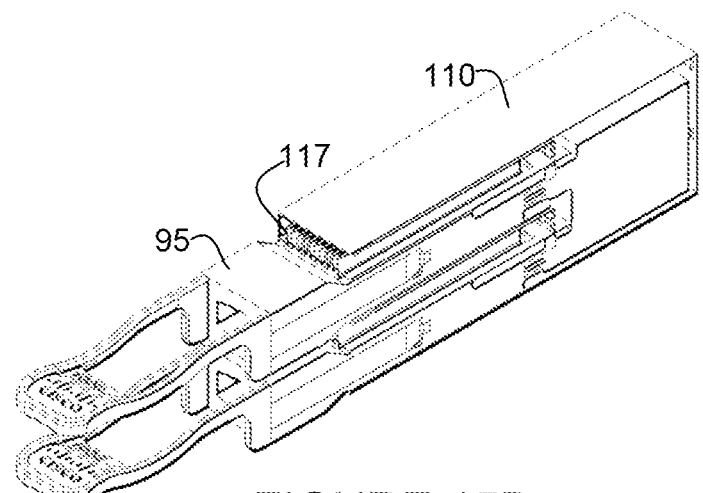
FIG. 15B is a perspective of the optical modules with integrated heatsinks installed in the optical module cage of FIG. 15A with a side wall removed to show detail.
Figure 15C:
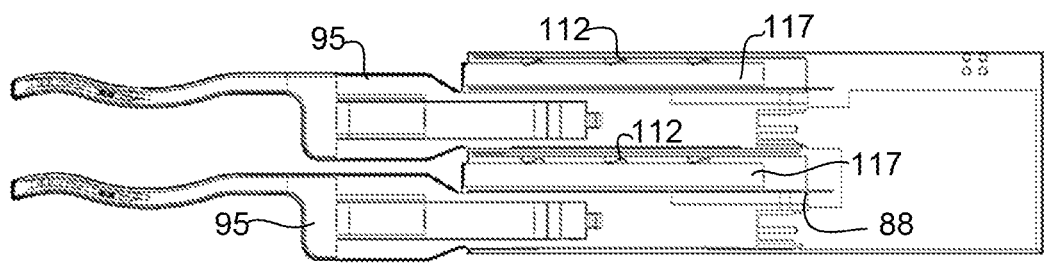
FIG. 15C is a side view of the optical modules with integrated heatsinks installed in the optical module cage of FIG. 15B.

FIGS. 12A-15C illustrate an optical module cage 110 with a spring (spring members 112) located on an upper surface of the heatsink opening 126 (top plate 113, center plate 114). FIGS. 12A-12C show the optical modules 94 inserted into the optical module cage 110 with no heatsink. FIGS. 13A-14B illustrate the riding heatsink 107 inserted into the heatsink opening 126 in the optical module cage 110. FIGS. 15A-15C show the optical modules 95 with integrated heatsinks 117 inserted into the optical module cage 110.

Figure 12B:
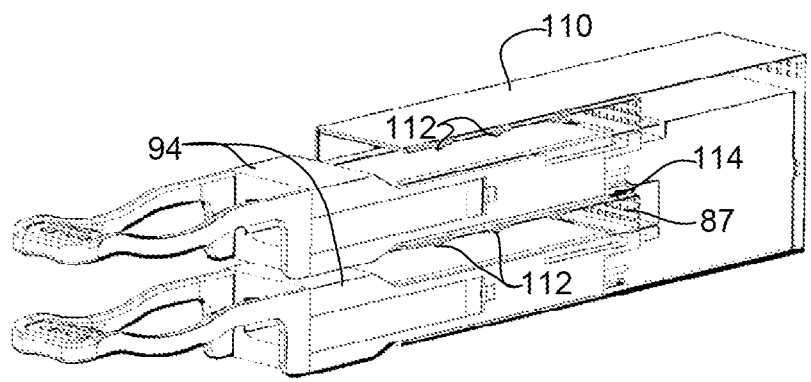
FIG. 12B is a perspective of the optical modules and optical module cage of FIG. 12A with a side wall removed to show detail.
Figure 12C:
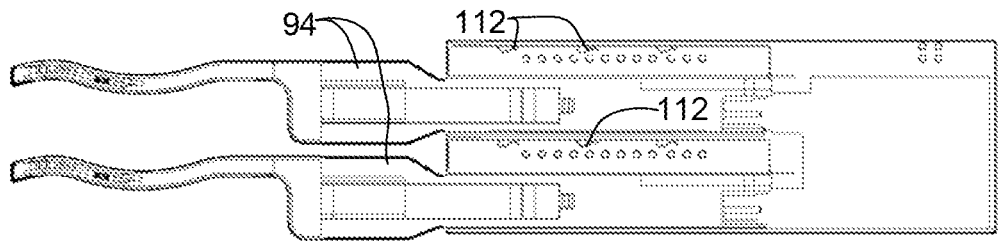
FIG. 12C is a side view of the optical modules and optical module cage of FIG. 12B.

Referring now to FIGS. 12A-12C, the optical modules 94 are shown inserted into the optical module cage 110 with no heatsink. One of the side walls 115 is removed in FIGS. 12B and 12C to show details within the optical module cage 110. Spring members 112 are located on an inner (lower) surface of the top plate 113 and center plate 114 to exert downward pressure on the riding heatsink 107, as described below with respect to FIGS. 13A-14B. Since there is no riding heatsink installed in FIGS. 12A-12C, the spring members 112 are in their uncompressed (relaxed) position. In the example shown, three rows of spring members 112 are positioned on an upper wall of the heatsink opening 126. It is to be understood that the location, spacing, shape, and number of spring members 112 shown in FIGS. 12A-12C is only an example and other configurations may be used without departing from the scope of the embodiments.

FIGS. 13A-13C show the riding heatsink 107 inserted into the heatsink opening 126. The spring members 112 are spaced along an upper surface of the openings 126 (top plate 113, center plate 114) and are compressed when the riding heatsink 107 is inserted into the optical module cage 110 to exert a downward pressure on the heatsink.

The downward pressure forces the lower portion 108 of the riding heatsink 107 (FIG. 13C) into thermal contact with the optical module 94 as shown in FIGS. 14A-14B.

FIGS. 14A and 14B show a perspective and side view, respectively, of the optical modules 94 and heatsinks 107 inserted into the optical module cage 110. One side wall 115 of the optical module cage 110 is removed to show details within the cage. The spring members 112 are in a compressed state and exert a downward force on the riding heatsink 107 to ensure thermal contact between the heatsink 107 and the optical module 94.

FIGS. 15A-15C illustrate the optical modules 95 with integrated heatsinks 117 inserted into the optical module cage 110. Since the heatsinks 117 are connected to the optical module 95, there is no need to exert a downward force on the heatsink and the spring members 112 remain in their uncompressed state.

Figure 16A:
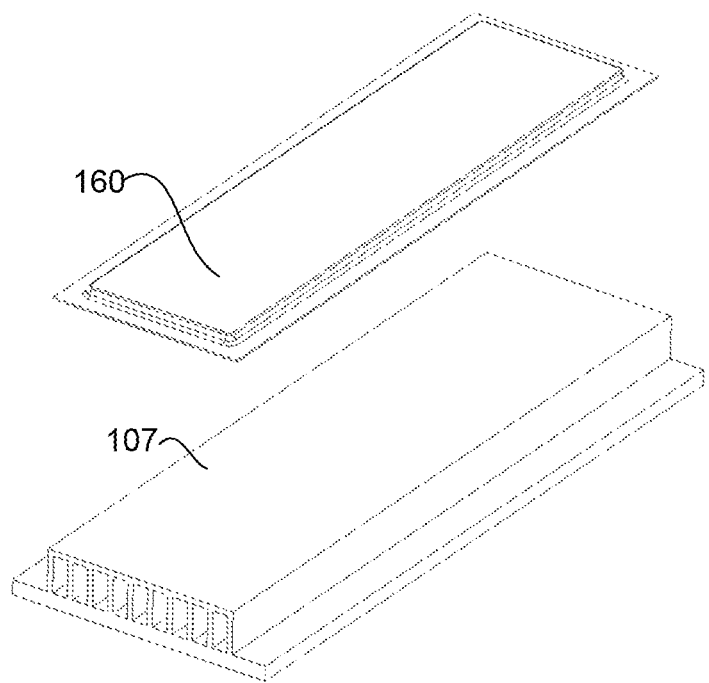
FIG. 16A is an exploded perspective of a thermal pad and riding heatsink, in accordance with one embodiment.
Figure 16B:
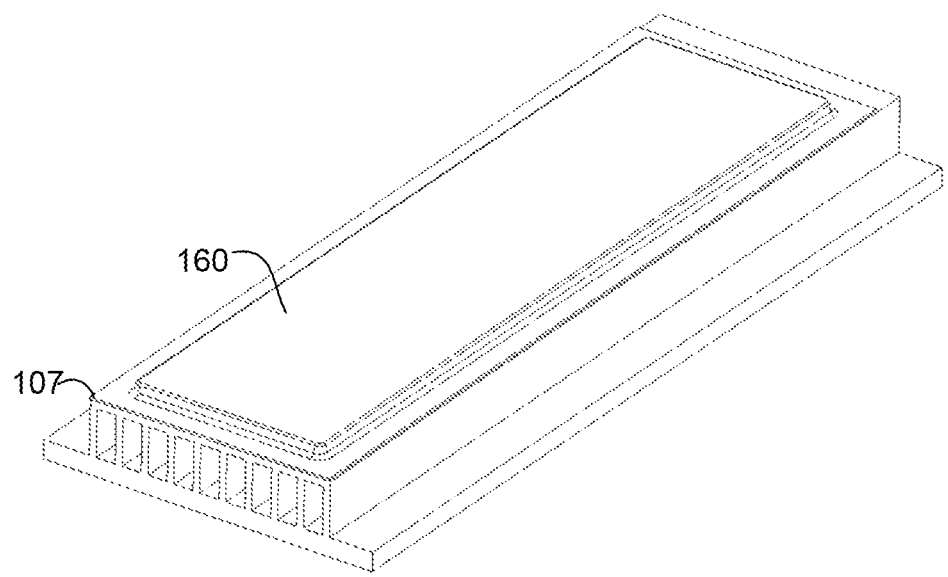
FIG. 16B is a perspective of the thermal pad attached to the riding heatsink.
Figure 17A:
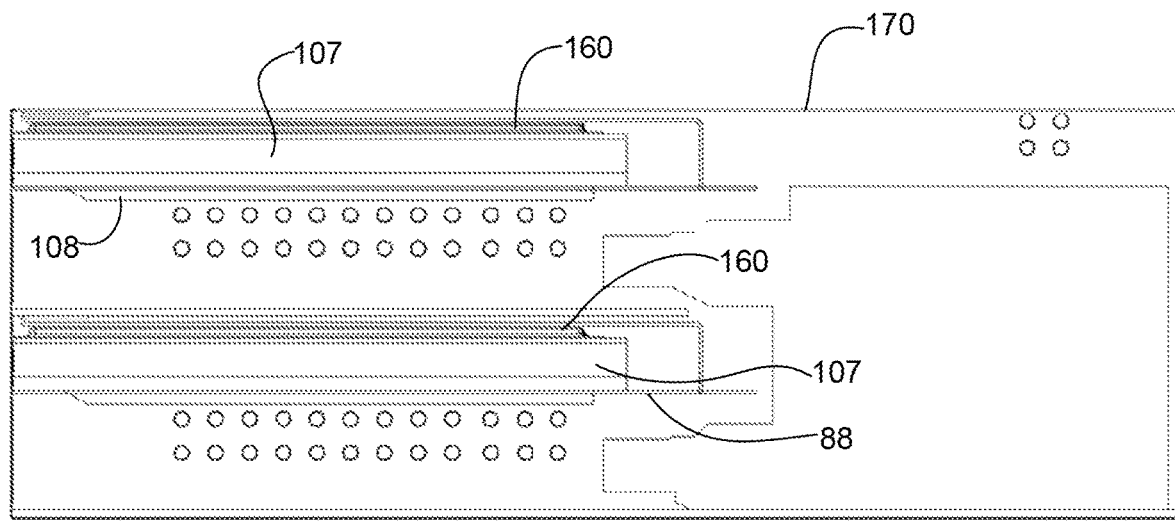
FIG. 17A is a side view of the thermal pad and riding heatsink of FIG. 16B installed in an optical module cage, in accordance with one embodiment.
Figure 17B:
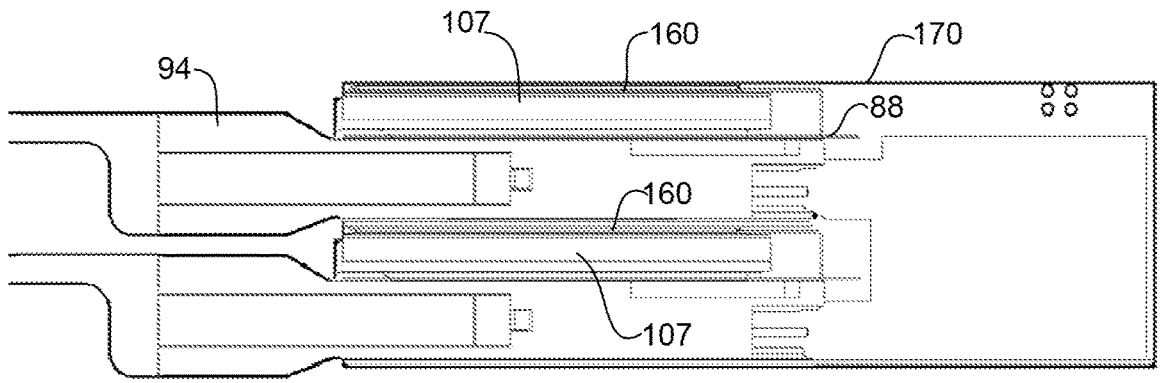
FIG. 17B is a side view of the thermal pad and riding heatsink of FIG. 16B installed in the optical module cage of FIG. 17A with the optical modules installed.

As previously noted, a spring may also be located on the riding heatsink 107 rather than on the optical module cage 80, 110. FIGS. 16A-16B illustrate one example of a spring 160 attached to an upper surface of the riding heatsink 107. FIG. 16A is an exploded perspective of the riding heatsink and a recoverable (compressible) thermal pad (spring) 160. FIG. 16B shows the thermal pad 160 attached to an upper surface of the heatsink. The thermal pad 160 may comprise, for example, a thin polycarbonate layer (e.g., 2 mils) and PSA (pressure sensitive adhesive) to secure the pad to the upper surface of the riding heatsink 107. As shown in FIG. 17A, when the optical modules are not installed in an optical module cage 170, the thermal pad 160 is not compressed and the riding heatsinks are in a free unloaded position. When the optical modules 94 are inserted into the cage 170, the riding heatsinks are in a loaded position and a lower surface of the heatsink (pedestal) 108 is in contact with a top surface of the optical module 94 with the thermal gap pad 160 compressed.

Figure 18A:
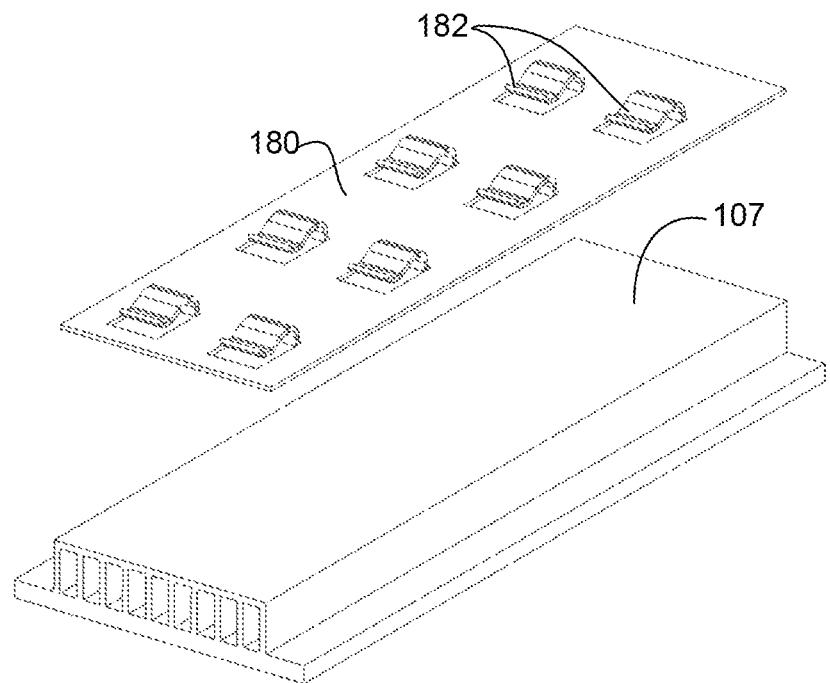
FIG. 18A is an exploded perspective of a spring sheet and the riding heatsink, in accordance with one embodiment.
Figure 18B:
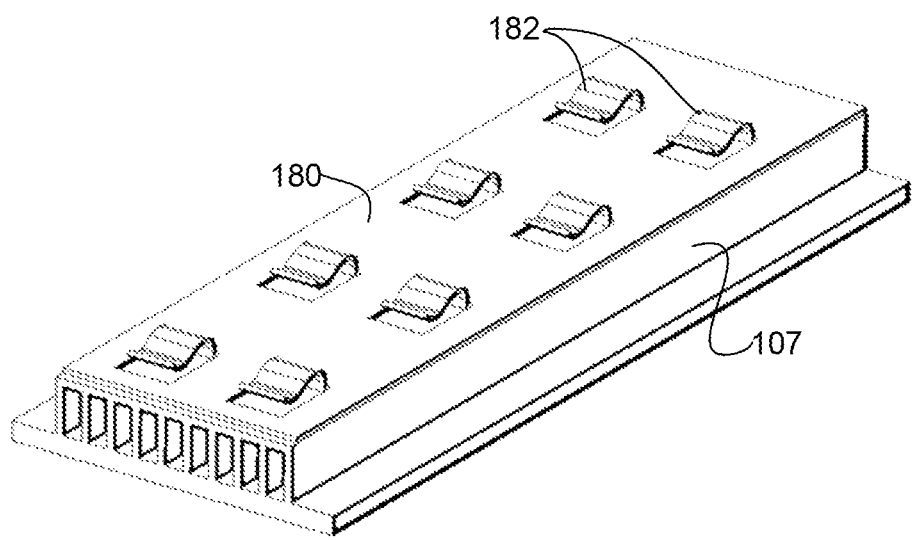
FIG. 18B is a perspective of the spring sheet attached to the riding heatsink.

FIG. 18A is an exploded perspective of the pluggable riding heatsink 107 and a recoverable (compressible) spring plate (spring) 180 comprising a plurality of spring fingers 182 comprising curved metal tabs. The spring fingers 182 may be formed, for example, from copper or any other suitable material and the spring plate may comprise any number of spring members in any arrangement. FIG. 18B shows the spring plate 180 attached to an upper surface of the riding heatsink 107. When the optical modules are installed in the cage with the riding heatsink, the spring members 182 exert a downward force on the heatsink 107 and ensure thermal contact between the heatsink and an upper surface of the optical module, as previously described for the thermal pad in FIG. 17B.

The optical module cage 80, 110, 170 shown in FIGS. 8A-15C, 17A, and 17B is in a stacked 2×1 arrangement. As previously noted, the optical module cage may have other configurations for receiving any number of optical modules. FIGS. 19A and 19B illustrate an example of an optical module cage 190 in a side-by-side arrangement (1×2). The optical module cage 190 comprises a vertical guide wall 191 with a slot formed therein. In this example, the spring fingers 92 are located on opposing internal side walls of the heatsink openings 196. The horizontal guide rails 88 extend from optical module cage side walls 195 and the vertical center wall 191. As previously described, the spring fingers force the riding heatsink downward against the guide rail 88 to ensure contact between the riding heatsink and the optical module. The optical module cage may also include spring members on an upper wall of the heatsink opening or spring members may be attached to the heatsink, as previously described. FIG. 19B shows two side-by-side optical modules 95 with integrated heatsinks 117 inserted into the optical module cage 190. The optical module cage 190 may also receive optical modules without heatsinks or may include riding heatsinks, as previously described.

Figure 20:
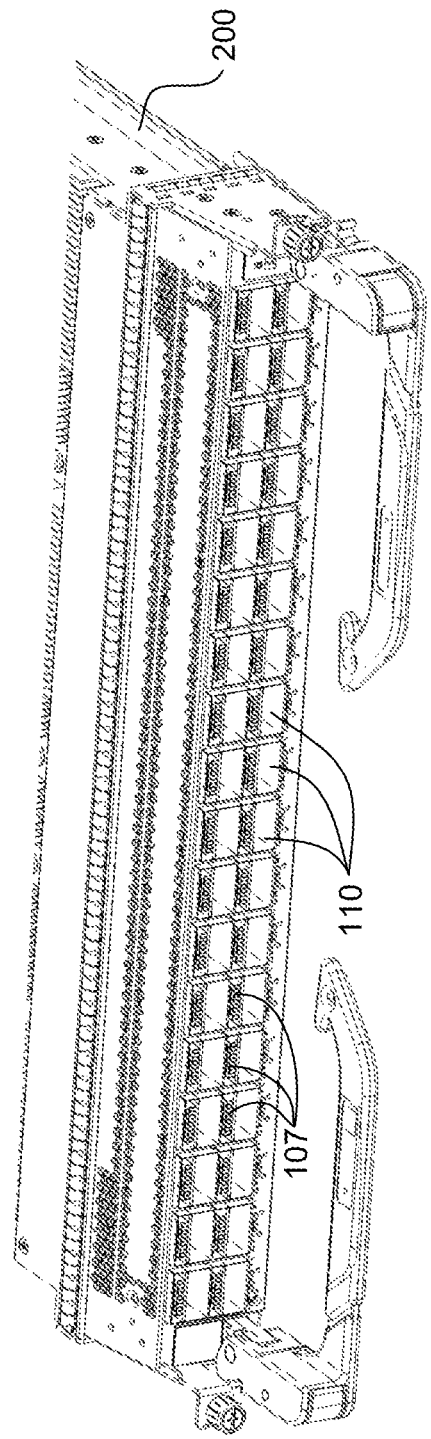
FIG. 20 is a partial perspective of a line card with a plurality of the optical module cages with riding heatsinks of FIG. 13A installed, in accordance with one embodiment.

In one or more embodiments, the optical module cages described herein may be located within a line card 200 as shown in FIG. 20. The line card may operate in the context of a data communications network including multiple network devices.

The network may include any number of network devices in communication via any number of nodes (e.g., routers, switches, gateways, controllers, edge devices, access devices, aggregation devices, core nodes, intermediate nodes, or other network devices), which facilitate passage of data over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

As previously described, the optical modules are coupled to electronic components (e.g., one or more integrated circuit cards mounted on one or more circuit boards along with supporting components). The line card 200 may comprise one or more of the electronic components, associated heatsinks, and connectors (not shown). The electronic components and circuits may be operable to interface telecommunication lines (e.g., copper wire, optical fibers) in a telecommunications network. The line card 200 may be configured to perform one or more operations and receive any number or type of pluggable transceiver modules configured for transmitting and receiving signals, and may be configured for operation in any type of chassis or network device (e.g., router, switch, gateway, controller, edge device, access device, aggregation device, core node, intermediate node, or other network device).

Figure 21:
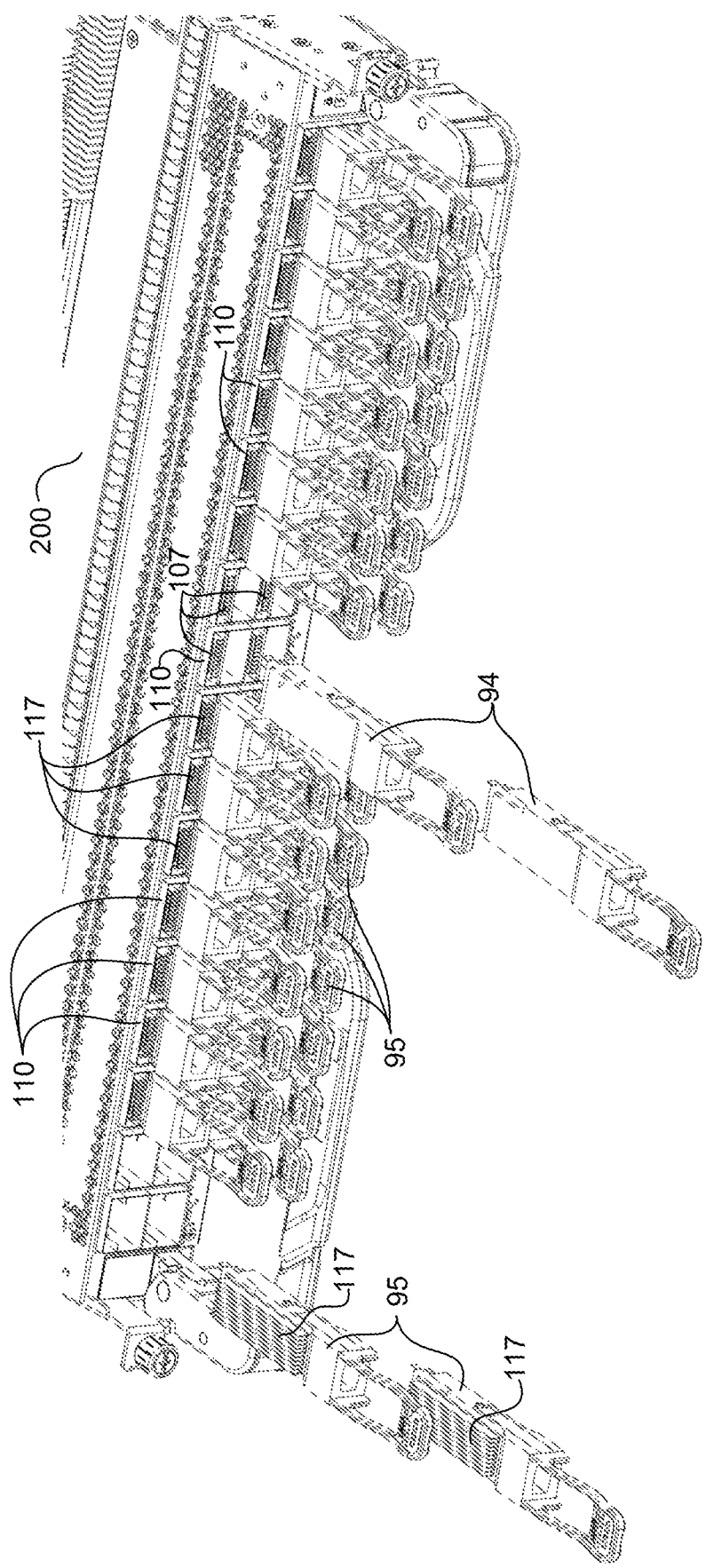
FIG. 21 is a partial perspective of the line card with integrated heatsinks installed in optical module cages, optical module cages with no optical modules or heatsinks installed, optical modules with integrated heatsinks removed from the optical module cages, and optical modules removed from optical module cages with riding heatsinks.

In the example shown in FIG. 20, the line card 200 comprises a plurality of optical module cages 110 comprising riding heatsinks 107. The line card 200 may also comprise different configurations of optical modules and heatsinks as shown in FIG. 21. For example, as shown in FIG. 21, one or more of the optical module cages 110 may receive the optical module 95 with integrated heatsink 117. One or more of the optical module cages 110 may receive the optical modules 94 and the riding heatsinks 107.

As previously described, the optical module cages are configured for receiving an optical module with no heatsink, an optical module with a riding heatsink, or an optical module with an integrated heatsink. This allows for ease of update of an optical module without replacing the optical module cage or redesigning the line card. For example, since the optical module cage is backward compatible, an earlier version of an optical module (e.g., lower power optical module) may be inserted without a heatsink. The optical module may be replaced with a medium power optical module and a riding heatsink inserted into the cage. The riding heatsink and optical module may be removed and replaced with a high power optical module with an integrated heatsink, without any change to the optical module cage. The optical module cage may be designed for compatibility with various optical form factors including SFP, QSFP, OSFP, CFP, CFP2, CFP8, QSFPDD, or any other current or future form factor, while providing the capability to easily change the heatsink configuration to meet the needs of the optical module.

Figure 22:
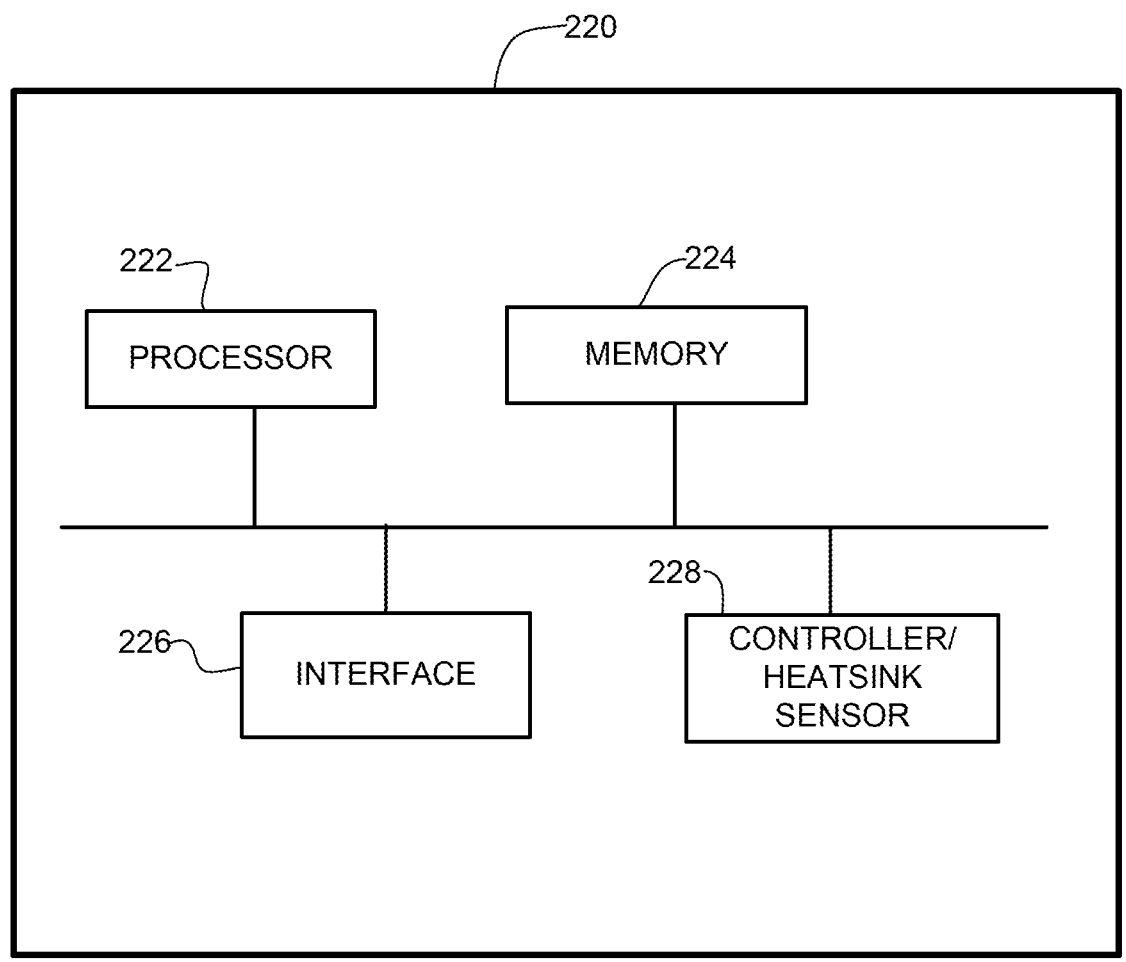
FIG. 22 is a block diagram depicting an example of a network device in which the embodiments described herein may be implemented.

FIG. 22 illustrates an example of a network device 220 that may implement the embodiments described herein. The network device may comprise one or more line cards (e.g., line card 200 in FIGS. 20 and 21) comprising any number of optical module cages described herein. In one embodiment, the network device 220 is a programmable machine that may be implemented in hardware, software, or any combination thereof. The network device 220 includes one or more processor 222, memory 224, network interface (port) 226, and controller (e.g., code, software, logic, device) and heatsink sensor 228.

Memory 224 may be a volatile memory or non-volatile storage, which stores various applications, operating systems, modules, and data for execution and use by the processor 222. The network device 220 may include any number of memory components.

Logic may be encoded in one or more tangible media for execution by the processor 222. For example, the processor 222 may execute codes stored in a computer-readable medium such as memory 224. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 220 may include any number of processors 222.

The network interface 226 may comprise any number of interfaces (line cards, ports) for receiving data or transmitting data to other devices. The network interface 226 may include, for example, an optical interface at an optical module.

The controller/heatsink sensor 228 may comprise one or more components including, for example, a sensor located within the host connector 62, as previously described with respect to FIGS. 6A-6C, for use in identifying if a pluggable riding heatsink is installed in the optical module cage. The sensor may provide a signal to a controller, which may signal an alert or reduce power applied to the optical module if the optical module is configured for use with a riding heatsink and no riding heatsink is detected.

It is to be understood that the network device 220 shown in FIG. 22 and described above is only an example and that different configurations of network devices may be used. For example, the network device 220 may further include any suitable combination of hardware, software, algorithms, processors, devices, components, or elements operable to facilitate the capabilities described herein.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An optical module cage comprising: a first opening for slidably receiving an optical module;
   a second opening positioned adjacent to said first opening for slidably receiving a riding heatsink separate from the optical module in a first configuration and an integrated heatsink connected to the optical module in a second configuration; and a guide rail comprising two rails extending inward from side walls of the optical module cage and interposed between said first opening and said second opening, wherein the guide rail is configured to support the riding heatsink and not interfere with insertion of the integrated heatsink.

2. The optical module cage of claim 1 wherein the rails are spaced from one another to provide a channel for receiving the integrated heatsink.

3. The optical module cage of claim 1 wherein the optical module comprises a QSFP (Quad Small Form-Factor Pluggable) inserted into said first opening without the riding heatsink, the guide rail providing a guide for insertion of the optical module into said first opening generally aligned with a connector.

4. The optical module cage of claim 1 wherein the optical module comprises a QSFP (Quad Small Form-Factor Pluggable) inserted in said first opening and wherein the riding heatsink is inserted into said second opening.

5. The optical module cage of claim 1 further comprising the optical module and the integrated heatsink inserted into said first and second openings of the optical module cage.

6. The optical module cage of claim 1 further comprising a spring for exerting a downward force on the riding heatsink to ensure thermal contact between the riding heatsink and the optical module.

7. The optical module cage of claim 6 wherein the spring comprises spring members connected to side walls of said second opening and operable in combination with the guide rail to exert said downward force on the riding heatsink.

8. The optical module cage of claim 6 wherein the spring is connected to an upper plate defining said second opening for exerting said downward force on the riding heatsink.

9. The optical module cage of claim 6 wherein the spring comprises a plurality of spring fingers.

10. The optical module cage of claim 6 wherein the spring is disposed on an upper surface of the heatsink.

11. The optical module cage of claim 10 wherein the spring comprise a compressible pad.

12. The optical module cage of claim 1 further comprising an EMI (Electromagnetic Interference) shield at a rear wall of said second opening to allow airflow along fins of the riding heatsink or the integrated heats ink while reducing EMI emissions.

13. The optical module cage of claim 1 wherein the optical module cage is configured for receiving two optical modules side-by-side or a single optical module having an increased width.

14. The optical module cage of claim 1 further comprising a sensor operable to detect insertion of the riding heatsink and transmit a signal to a line card controller.

15. An optical module cage comprising: a first opening for receiving an optical module;
   a second opening positioned adjacent to said first opening and comprising a riding heatsink; and a guide rail interposed between said first opening and said second opening and supporting the riding heatsink;
   wherein the riding heatsink is slidably removable from the second opening for insertion of an optical module with an integrated heatsink into said first and second openings and wherein side walls of the optical module cage are configured to support rails of the guide rail.

16. The optical module cage of claim 15 wherein the guide rail comprises two rails extending inward from the side walls and spaced from one another to provide a channel for receiving the integrated heatsink.

17. The optical module cage of claim 15 further comprising a spring for exerting a downward force on the riding heatsink to ensure thermal contact between the riding heatsink and the optical module.

18. The optical module cage of claim 15 wherein the riding heatsink is attached to a sleeve slidably receivable in the optical module cage with the optical module inserted therein.

19. A stacked optical module cage comprising: optical module openings for slidably receiving optical modules;
   heatsink openings each configured for slidably receiving a riding heatsink separate from the optical modules in a first configuration and an integrated heatsink connected to one of the optical modules in a second configuration; and
   guide rails extending inward from side walls of the stacked optical module cage and interposed between said optical module openings and said heatsink openings, wherein the guide rails are configured to support the riding heatsinks without interfering with insertion of the integrated heatsinks.

* * * * *